US010660240B2

(12) United States Patent
Miranda Gavillan et al.

(10) Patent No.: US 10,660,240 B2
(45) Date of Patent: May 19, 2020

(54) METHOD FOR PROVIDING AN ACCESS AREA FOR A DATA STORAGE LIBRARY

(71) Applicant: International Business Machines Corporation, Armonk, NY (US)

(72) Inventors: Jose G. Miranda Gavillan, Tucson, AZ (US); Brian G. Goodman, Tucson, AZ (US); Leonard G. Jesionowski, Tucson, AZ (US); Michael P. McIntosh, Tucson, AZ (US); Shawn M. Nave, Tucson, AZ (US); Kenny Nian Gan Qiu, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 15/460,472

(22) Filed: Mar. 16, 2017

(65) Prior Publication Data
US 2018/0268861 A1    Sep. 20, 2018

(51) Int. Cl.
*H05K 7/20* (2006.01)
*G11B 33/14* (2006.01)
*G11B 15/68* (2006.01)

(52) U.S. Cl.
CPC ......... *H05K 7/20836* (2013.01); *G11B 15/68* (2013.01); *G11B 33/14* (2013.01);
(Continued)

(58) Field of Classification Search
CPC ........... H05K 7/20145; H05K 7/20709; H05K 7/20736; H05K 7/20745; H05K 7/20781;
(Continued)

(56) References Cited

U.S. PATENT DOCUMENTS

| 4,831,476 A | 5/1989 | Branc et al. |
| 4,838,911 A | 6/1989 | Robertson et al. |

(Continued)

FOREIGN PATENT DOCUMENTS

| CN | 102192631 A | 9/2011 |
| CN | 102407663 A | 4/2012 |

(Continued)

OTHER PUBLICATIONS

List of IBM Patents or Applications Treated as Related.
(Continued)

*Primary Examiner* — Henry T Crenshaw
*Assistant Examiner* — Daniel C Comings
(74) *Attorney, Agent, or Firm* — Scully, Scott, Murphy & Presser, P.C.; Alvin Borromeo, Esq.

(57) ABSTRACT

A method of servicing a data storage library includes providing an enclosure configured to surround at least one library access opening to form a chamber. The at least one enclosure has an access opening of sufficient size to permit an adult human access to the interior chamber, and the enclosure is configured to resist environmental conditions from the exterior of the enclosure from intruding into the chamber and to permit environmental conditions from the interior of the library to intrude into the chamber. The method also includes acclimating the chamber so that at least one desired environmental condition in the chamber is within a desired range of the corresponding environmental condition within the interior of the library. Additionally, the method includes accessing the interior of the library via the at least one library access opening.

24 Claims, 16 Drawing Sheets

(52) U.S. Cl.
CPC ..... *H05K 7/20145* (2013.01); *H05K 7/20709* (2013.01); *H05K 7/20745* (2013.01)

(58) Field of Classification Search
CPC .............. H05K 7/2079; H05K 7/20818; H05K 7/20827; H05K 7/20836
See application file for complete search history.

(56) References Cited

U.S. PATENT DOCUMENTS

| | | |
|---|---|---|
| 5,278,708 A | 1/1994 | Apple et al. |
| 5,449,229 A | 9/1995 | Aschenbrenner et al. |
| 5,940,354 A | 8/1999 | Inoue |
| 6,347,020 B1 | 2/2002 | Carpenter et al. |
| 6,366,982 B1 | 4/2002 | Suzuki et al. |
| 6,409,450 B1 | 6/2002 | Ostwald et al. |
| 6,457,928 B1 | 10/2002 | Ryan |
| 6,467,285 B2 | 10/2002 | Felder et al. |
| 6,478,524 B1 | 11/2002 | Malin |
| 6,494,663 B2 | 12/2002 | Ostwald et al. |
| 6,537,013 B2 | 3/2003 | Emberty et al. |
| 6,563,771 B1 | 5/2003 | Debiez |
| 6,661,596 B2 | 12/2003 | Chliwnyj et al. |
| 6,676,026 B1 | 1/2004 | McKinley et al. |
| 6,676,505 B2 | 1/2004 | Behl |
| 6,854,275 B2 | 2/2005 | Evans |
| 6,896,612 B1 | 5/2005 | Novotny |
| 6,924,981 B2 | 8/2005 | Chu et al. |
| 6,940,716 B1 | 9/2005 | Korinsky et al. |
| 7,039,924 B2 | 5/2006 | Goodman et al. |
| 7,106,538 B2 | 9/2006 | Minemura et al. |
| 7,277,247 B2 | 10/2007 | Hoshino |
| 7,434,412 B1 | 10/2008 | Miyahira |
| 7,474,497 B2 | 1/2009 | Jesionowski et al. |
| 7,635,246 B2 | 12/2009 | Neeper et al. |
| 7,656,602 B2 | 2/2010 | Iben et al. |
| 7,656,660 B2 | 2/2010 | Hoeft et al. |
| 7,746,634 B2 | 6/2010 | Hom et al. |
| 7,751,188 B1 | 7/2010 | French et al. |
| 7,961,419 B2 | 6/2011 | Suzuki et al. |
| 8,051,671 B2 | 11/2011 | Vinson et al. |
| 8,141,621 B2 | 3/2012 | Campbell et al. |
| 8,151,046 B2 | 4/2012 | Suzuki et al. |
| 8,206,976 B2 | 6/2012 | Kobayashi et al. |
| 8,209,993 B2 * | 7/2012 | Carlson ................ F24F 11/0001 62/259.2 |
| 8,210,914 B2 | 7/2012 | McMahan et al. |
| 8,456,840 B1 | 6/2013 | Clidaras et al. |
| 8,514,513 B2 | 8/2013 | Hori |
| 8,544,289 B2 | 10/2013 | Johnson et al. |
| 8,675,303 B2 | 3/2014 | Compton et al. |
| 8,694,152 B2 | 4/2014 | Cyrulik et al. |
| 8,789,384 B2 | 7/2014 | Eckberg et al. |
| 8,849,784 B2 | 9/2014 | Alber et al. |
| 8,857,208 B2 | 10/2014 | Malin |
| 8,939,524 B2 | 1/2015 | Gasser |
| 8,974,274 B2 | 3/2015 | Carlson |
| 9,025,275 B1 | 5/2015 | Manes et al. |
| 9,043,035 B2 | 5/2015 | Chainer et al. |
| 9,069,534 B2 | 6/2015 | Rogers |
| 9,110,641 B2 | 8/2015 | Wu |
| 9,155,230 B2 | 10/2015 | Eriksen |
| 9,190,112 B1 | 11/2015 | Bayang et al. |
| 9,240,209 B1 | 1/2016 | Crawford et al. |
| 9,255,936 B2 | 2/2016 | Hunt et al. |
| 9,291,408 B2 | 3/2016 | Iyengar et al. |
| 9,321,136 B2 | 4/2016 | Eckberg et al. |
| 9,361,921 B2 | 6/2016 | Herget |
| 9,368,148 B2 | 6/2016 | Starr et al. |
| 9,433,122 B2 | 8/2016 | Ohba et al. |
| 9,642,286 B1 | 5/2017 | Gutierrez et al. |
| 9,888,615 B1 | 2/2018 | Frink et al. |
| 9,916,869 B1 | 3/2018 | Miranda Gavillan et al. |
| 10,004,165 B1 | 6/2018 | Bailey |
| 10,026,455 B1 | 7/2018 | Miranda Gavillan et al. |
| 10,045,457 B1 | 8/2018 | Miranda Gavillan et al. |
| 2002/0023444 A1 | 2/2002 | Felder et al. |
| 2002/0098064 A1 | 7/2002 | Ostwald et al. |
| 2003/0039056 A1 | 2/2003 | Satoh |
| 2003/0197619 A1 | 10/2003 | Lawrence et al. |
| 2004/0025515 A1 | 2/2004 | Evans |
| 2004/0080244 A1 | 4/2004 | Lowther et al. |
| 2004/0145468 A1 | 7/2004 | La et al. |
| 2004/0153386 A1 | 8/2004 | Eckerdt |
| 2004/0165358 A1 | 8/2004 | Regimbal et al. |
| 2004/0264042 A1 | 12/2004 | Pollard et al. |
| 2005/0057847 A1 | 3/2005 | Armagost et al. |
| 2005/0170770 A1 | 8/2005 | Johnson et al. |
| 2005/0185323 A1 | 8/2005 | Brace et al. |
| 2005/0270727 A1 | 12/2005 | Shih |
| 2006/0177922 A1 | 8/2006 | Shamah et al. |
| 2006/0250578 A1 | 11/2006 | Pohl et al. |
| 2006/0259195 A1 | 11/2006 | Eliuk et al. |
| 2006/0262447 A1 | 11/2006 | Hoshino |
| 2007/0180278 A1 | 8/2007 | Botchek |
| 2007/0250410 A1 | 10/2007 | Brignone et al. |
| 2008/0043371 A1 | 2/2008 | Konshak et al. |
| 2008/0061138 A1 | 3/2008 | Fisher et al. |
| 2008/0065903 A1 | 3/2008 | Goodman et al. |
| 2008/0094797 A1 | 4/2008 | Coglitore et al. |
| 2008/0106368 A1 | 5/2008 | Vitier |
| 2008/0151491 A1 | 6/2008 | Baldwin et al. |
| 2008/0231152 A1 | 9/2008 | Malin |
| 2009/0046427 A1 | 2/2009 | Noteboom et al. |
| 2009/0061758 A1 | 3/2009 | Yeung et al. |
| 2009/0168345 A1 | 7/2009 | Martini |
| 2009/0266511 A1 | 10/2009 | Yang |
| 2010/0078492 A1 | 4/2010 | Cislo |
| 2010/0170277 A1 | 7/2010 | Schmitt et al. |
| 2010/0188810 A1 | 7/2010 | Andersen et al. |
| 2010/0249987 A1 | 9/2010 | Hong et al. |
| 2010/0254241 A1 | 10/2010 | Aoki |
| 2011/0022771 A1 | 1/2011 | Foerster |
| 2011/0083824 A1 * | 4/2011 | Rogers ............... H05K 7/20745 165/80.2 |
| 2011/0108207 A1 | 5/2011 | Mainers et al. |
| 2011/0231007 A1 | 9/2011 | Biehle et al. |
| 2012/0046792 A1 | 2/2012 | Secor |
| 2012/0155027 A1 | 6/2012 | Broome et al. |
| 2012/0305042 A1 | 12/2012 | Lorbiecki |
| 2013/0031928 A1 | 2/2013 | Kim |
| 2013/0058029 A1 * | 3/2013 | Ootani ............... H05K 7/20745 361/679.31 |
| 2013/0088833 A1 | 4/2013 | Cox et al. |
| 2013/0128455 A1 | 5/2013 | Koblenz et al. |
| 2013/0244563 A1 | 9/2013 | Noteboom et al. |
| 2014/0019768 A1 | 1/2014 | Pineau et al. |
| 2014/0059946 A1 | 3/2014 | Gardner et al. |
| 2014/0206271 A1 | 7/2014 | Ignacio |
| 2014/0238639 A1 | 8/2014 | Ambriz et al. |
| 2014/0277765 A1 | 9/2014 | Karimi et al. |
| 2014/0290162 A1 | 10/2014 | Tanimoto |
| 2014/0293471 A1 | 10/2014 | Sakuma |
| 2015/0036293 A1 | 2/2015 | Martini |
| 2015/0086305 A1 | 3/2015 | Ostwald et al. |
| 2015/0088319 A1 | 3/2015 | Dasari et al. |
| 2015/0106654 A1 | 4/2015 | Foster et al. |
| 2015/0167996 A1 | 6/2015 | Fadell et al. |
| 2015/0179210 A1 | 6/2015 | Ostwald et al. |
| 2015/0203297 A1 | 7/2015 | Manning et al. |
| 2015/0269641 A1 | 9/2015 | Roy |
| 2015/0294525 A1 | 10/2015 | Broom et al. |
| 2016/0094898 A1 | 3/2016 | Primm et al. |
| 2016/0107312 A1 | 4/2016 | Morrill et al. |
| 2016/0109389 A1 | 4/2016 | Suzuki et al. |
| 2016/0112245 A1 | 4/2016 | Mankovskii |
| 2016/0117126 A1 | 4/2016 | De Spiegeleer et al. |
| 2016/0223455 A1 | 8/2016 | Minegishi |
| 2016/0240061 A1 | 8/2016 | Li et al. |
| 2016/0302332 A1 | 10/2016 | Anderson et al. |
| 2017/0010015 A1 | 1/2017 | Jan |
| 2017/0064876 A1 | 3/2017 | Leckelt et al. |
| 2017/0154483 A1 | 6/2017 | Cordiner et al. |
| 2017/0275012 A1 | 9/2017 | Tretow et al. |

(56) References Cited

U.S. PATENT DOCUMENTS

| | | | |
|---|---|---|---|
| 2017/0323666 | A1 | 11/2017 | Jesionowski et al. |
| 2017/0347496 | A1 | 11/2017 | Smith |
| 2018/0077819 | A1 | 3/2018 | Roy |
| 2018/0155975 | A1 | 6/2018 | Kempfle |
| 2018/0172304 | A1 | 6/2018 | Wolfson |
| 2018/0184548 | A1 | 6/2018 | Frink et al. |

FOREIGN PATENT DOCUMENTS

| | | |
|---|---|---|
| CN | 102881313 A | 1/2013 |
| CN | 204361533 U | 5/2015 |
| JP | 11-287499 | 10/1999 |
| JP | 2001093121 A | 4/2001 |
| JP | 2001307474 A | 11/2001 |
| JP | 2009087518 A | 4/2009 |
| JP | 2011191207 A | 9/2011 |
| WO | 2007099542 A2 | 9/2007 |
| WO | 2008014578 A1 | 2/2008 |
| WO | 2009134610 A2 | 11/2009 |
| WO | 2010067443 A1 | 6/2010 |

OTHER PUBLICATIONS

Hanaoka Y. et al., "Technologies for Realizing New ETERNUS LT270 High-End Tape Library System", FUJITSU Sci. Tech. J., 42.1, pp. 24-31, Jan. 2006.
McCormick-Goodhart M. et al, "The Design and Operation of a Passive Humidity-Controlled Cold Storage Vault Using Conventional Freezer Technology and Moisture-Sealed Cabinets", IS&T's 2004 Archiving Conference, Apr. 20-23, 2005, San Antonio, Texas.
Frachtenberg E. et al., "Thermal Design in the Open Compute Datacenter", Thermal and Thermomechanical Phenomena in Electronic Systems (ITherm), 13th IEEE I22012.
Oga, S. et al., "Indirect External Air Cooling Type Energy-Saving Hybrid Air Conditioner for Data Centers," F-COOL NEO"", Fuji Electric Review, vol. 60, No. 1, Mar. 30, 2014, pp. 59-64.
Lee, S. et al., "Thermoelectric-based Sustainable Self-Cooling for Fine-Grained Processor Hot Spots", 15th IEEE ITHERM Conference, May 31-Jun. 3, 2016, pp. 847-856.
Disclosed Anonymously, Ip.com, "Method for a Direct Air Free Cooling with a real time hygrometry regulation for Data Center", IPCOM000200312D, Oct. 5, 2010, pp. 1-3.
Rasmussen N., "Cooling Options for Rack Equipment with Side-to-Side Airflow", www.apc.com, 2004.
Ouchi M. et al., "Thermal Management Systems for Data Centers with Liquid Cooling Technique of CPU", ITherm IEEE 13th Intersociety Conference, May 30-Jun. 1, 2012, pp. 790-798.
Authors: IBM, "Energy Efficient Cooling System for Data Center", IPCOM000182040D, Apr. 23, 2009, pp. 1-4.
Ernest S. Gale et al., U.S. Appl. No. 15/460,389, filed Mar. 16, 2017.
Ernest S. Gale et al., U.S. Appl. No. 15/460,397, filed Mar. 16, 2017.
Ernest S. Gale et al., U.S. Appl. No. 15/460,403, filed Mar. 16, 2017.
Ernest S. Gale et al., U.S. Appl. No. 15/460,420, filed Mar. 16, 2017.
Jose G. Miranda Gavillan et al., U.S. Appl. No. 15/460,345, filed Mar. 16, 2017.
Jose G. Miranda Gavillan et al., U.S. Appl. No. 15/460,357, filed Mar. 16, 2017.
Jose G. Miranda Gavillan et al., U.S. Appl. No. 15/460,379, filed Mar. 16, 2017.
Jose G. Miranda Gavillan et al., U.S. Appl. No. 15/460,402, filed Mar. 16, 2017.
Jose G. Miranda Gavillan et al., U.S. Appl. No. 15/460,423, filed Mar. 16, 2017.
Jose G. Miranda Gavillan et al., U.S. Appl. No. 15/460,441, filed Mar. 16, 2017.
Jose G. Miranda Gavillan et al., U.S. Appl. No. 15/460,456, filed Mar. 16, 2017.
Jose G. Miranda Gavillan et al., U.S. Appl. No. 15/460,472, filed Mar. 16, 2017.
Jose G. Miranda Gavillan et al., U.S. Appl. No. 15/460,479, filed Mar. 16, 2017.
Jose G. Miranda Gavillan et al., U.S. Appl. No. 15/460,429, filed Mar. 16, 2017.
Jose G. Miranda Gavillan et al., U.S. Appl. No. 15/460,439, filed Mar. 16, 2017.
Ernest S. Gale et al., U.S. Appl. No. 15/460,497, filed Mar. 16, 2017.
Office Action dated Mar. 25, 2019 issued in U.S. Appl. No. 15/979,601.
Ex Parte Quayle Action dated May 1, 2019 issued in U.S. Appl. No. 15,460,497.
Office Action dated May 9, 2019 issued in U.S. Appl. No. 15/460,456.
Office Action dated Apr. 25, 2019 issued in U.S. Appl. No. 15/460,439.
Office Action dated Oct. 22, 2019 received in U.S. Appl. No. 15/460,429.
Office Action dated Feb. 14, 2020 received in U.S. Appl. No. 15/460,429, 8 pages total.

* cited by examiner

METHOD FOR PROVIDING AN ACCESS AREA FOR A DATA STORAGE LIBRARY

BACKGROUND

The present invention relates to a data storage library for the storage and data transfer of data storage media, and more specifically, to a method of servicing the data storage library utilizing at least one enclosure configured to surround at least one access opening of the data storage library.

Automated data storage libraries are known for providing cost effective storage and retrieval of large quantities of data. The data in automated data storage libraries is typically stored on media of data storage cartridges that are, in turn, stored at storage slots or the like inside the library in a fashion that renders the media, and its resident data, accessible for physical retrieval. Such data storage cartridges are commonly termed "removable media." Data storage cartridge media may comprise any type of media on which data may be stored and which may serve as removable media, including but not limited to magnetic media (such as magnetic tape or disks), optical media (such as optical tape or disks), electronic media (such as PROM, EEPROM, flash PROM, COMPACTFLASH™, SMARTMEDIA™, MEMORY STICK™, etc.), or other suitable media. An example of a data storage cartridge that is widely employed in automated data storage libraries for mass data storage is a magnetic tape cartridge.

In addition to data storage media, automated data storage libraries typically comprise data storage drives that store data to, and/or retrieve data from, the data storage cartridge media. Further, automated data storage libraries typically comprise I/O stations at which data storage cartridges are supplied or added to, or removed from, the library. The transport of data storage cartridges between data storage slots, data storage drives, and I/O stations is typically accomplished by one or more robotic accessors. Such accessors have grippers for physically retrieving the selected data storage cartridges from the storage slots within the automated data storage library and transporting such cartridges to the data storage drives by moving, for example, in the horizontal (X) and vertical (Y) directions.

In an effort to increase storage capacity, deep slot technology allows for storage cells that contain more than a single data storage cartridge. Such storage libraries allow for higher density, or more cartridges stored per square foot. In "deep slot" libraries, two or more cartridges may be stored in a multi-cartridge deep slot cell, arrayed in series, one behind the other, in tiers ranging from a front-most tier to a rearmost tier.

Efforts to improve the performance of traditional data centers attempt to minimize the cost of processing and storing data. One option that is employed to reduce operational costs of datacenters is to run the equipment in the datacenter at the high end of its environmental operational limits, thereby allowing for cooling of the datacenter to be reduced. In other words, datacenters are running increasingly hot and more humid conditions than traditional datacenters in an attempt to reduce operating costs. Although this strategy may be effective when applied to disk and/or flash data storage environments, magnetic tape is more susceptible to degradation when exposed to these unfavorable conditions. Therefore, this option is not available for magnetic tape libraries.

In an effort to control the environment within magnetic tape libraries so as to provide suitable working conditions for magnetic tape media, data storage drives, etc., air conditioning units may be incorporated into the data storage libraries themselves. While these air conditioning units effectively control the temperature and humidity within the data storage libraries, the environmental conditions of the area surrounding the data storage libraries remain largely unchanged, with conditions often being higher in both temperature and humidity. While this may allow a datacenter to operate at reduced costs, it may also result in a marked temperature differential between the interior and exterior environments of the data storage libraries. Such a temperature differential may prove problematic during service of the data storage library and/or replacement of data storage library components such as data storage cartridges, data storage drives, etc., as condensation may develop on replacement cartridges and other service parts during installation and/or removal from the data storage library. Condensation accumulation on such sensitive componentry may cause component failure and/or data loss.

SUMMARY

In accordance with an aspect of the disclosure, a method of servicing a data storage library having at least one access opening to permit access to an interior of the data storage library is disclosed. The method includes providing at least one enclosure configured to surround at least the at least one library access opening to form a chamber, wherein the at least one enclosure is configured and constructed to resist external environmental conditions from intruding into the chamber of the enclosure and to permit environmental conditions from the interior of the data storage library to intrude into the chamber of the enclosure, and acclimating the chamber of the enclosure so that at least one desired environmental condition in the chamber is within a desired range of the corresponding environmental condition within the interior of the data storage library. The method also includes accessing the chamber of the enclosure through the at least one enclosure access opening, and accessing the interior of the data storage library via the at least one library access opening.

The method may also include closing the at least one enclosure access opening, wherein closing the at least one enclosure access opening includes manipulating a zipper associated with the at least on enclosure access opening. Additionally, the method may include opening the at least one enclosure access opening to permit access to the chamber of the enclo sure.

The method may further include selectively providing air from the interior of the library to the chamber of the enclosure, and selectively opening at least one vent on the library in communication with the chamber of the enclosure. Additionally, the method may include disabling at least one of a data read operation, a data write operation, movement of at least one accessor, movement of all accessors and a combination thereof. The method may also include manipulating a selectively movable barrier associated with the at least one enclosure access opening, wherein the barrier consists of at least one of a door, a flap, multiple vertical strips and combinations thereof.

The method may comprise determining the desired environmental condition within the chamber of the enclosure and the corresponding environmental condition within the library frame, wherein determining whether the desired environmental condition within the chamber is within a desired range of the corresponding environmental condition within the interior of the library may be based upon the service technician's judgement. Alternatively and/or additionally, the desired environmental condition in the chamber of the enclosure may be determined using an environmental condition sensor located within the chamber of the enclosure and wherein the corresponding environmental condition within the library may be determined using an environmental condition sensor located within the library.

The method may also include configuring the enclosure to surround only the at least one access opening. Additionally, the method may include providing an enclosure environmental conditioning unit, the enclosure environmental conditioning unit being separate from any environmental conditioning unit associated with the library frame that is configured to condition the interior of the library frame; and configuring the separate enclosure environmental conditioning unit to condition the chamber of the enclosure.

In accordance with another aspect of the disclosure, a method of servicing a data storage library having at least one access opening to permit access to an interior of the data storage library is disclosed. The method may include providing at least one enclosure configured to surround at least the at least one library access opening and to form a chamber, the at least one enclosure having at least one enclosure access opening to permit access to the interior of the chamber, wherein the at least one enclosure is configured and constructed to resist external environmental conditions from intruding into the chamber of the enclosure while permitting the environmental conditions from within the data storage library to intrude into the interior chamber of the enclosure. The method may also include providing air from at least one environmental conditioning unit to the interior of the at least one enclosure, and accessing the data storage library via the at least one library access opening when at least one desired environmental condition within the interior of the at least one enclosure is within range of the corresponding environmental condition within an interior of the data storage library.

The method may also include checking if the at least one enclosure access opening is closed and, if not, closing the at least one enclosure access opening. Furthermore, the method may include setting up the enclosure to surround only the at least one enclosure access opening, and/or venting waste air generated by the at least one environmental conditioning unit so that it is not directed toward or into the interior of the at least one enclosure. Additionally, the method may include disabling at least one of a data read operation, a data write operation, movement of at least one accessor, movement of all accessors, and combinations thereof. The method may also include selectively opening at least one vent on the at least one library in communication with the interior of the enclosure.

The method may also comprise determining the desired environmental condition in the chamber of the enclosure using an environmental condition sensor located within the chamber of the enclosure and determining the corresponding environmental condition within the library using an environmental condition sensor located within the library frame. Also, the environmental conditioning unit may consist of at least one of an environmental conditioning unit associated with and for conditioning an interior of the library and an environmental conditioning unit separate from any environmental conditioning unit for conditioning the interior of the library and which does not condition the interior of the library, and combinations thereof.

According to another aspect of the disclosure, a method of servicing a data storage library having at least one access opening to permit access to an interior of the data storage library is disclosed. The method may include providing at least one enclosure configured to surround at least the at least one library access opening and to form a chamber, wherein the at least one enclosure is configured and constructed to resist external environmental conditions from intruding into the chamber of the enclosure, and providing at least one enclosure environmental conditioning unit fluidly coupled to the at least one enclosure. The method may also include providing air from the at least one enclosure environmental conditioning unit to an interior of the at least one enclosure, checking whether at least one desired environmental condition within the interior of the at least one enclosure is with range of the corresponding environmental condition within the interior of the library, and accessing the data storage library via the at least one library access opening.

In accordance with yet another aspect of the disclosure, another method of controlling at least one environmental condition during service of a data storage library is disclosed. The method may include providing at least one enclosure configured to surround at least one library access opening of the data storage library and to form a chamber, the at least one enclosure having at least one wall, the at least one wall containing at least one working opening and at least one enclosure access opening to permit access to the interior chamber, and wherein the at least one enclosure is configured and constructed to form a barrier to resist external environmental conditions from intruding into the chamber of the enclosure, and the working opening permits environmental conditions from within the data storage library to intrude into the interior chamber of the enclosure. The method may also include at least one of erecting and moving the enclosure so that at least one wall surrounds the at least one library access opening and forms a barrier to the external environmental conditions, and wherein the working opening of the enclosure is in communication with the library access opening to permit access to the interior of the data storage library, and communicating air from an interior of the data storage library to an interior of the at least one enclosure.

According to another aspect of the disclosure, a method of controlling at least one environmental condition exterior of a service opening to a data storage library is disclosed. The method may include at least one of erecting and moving an enclosure having at least one wall forming a barrier to resist at least one environmental condition from intruding into the interior of the enclosure, the at least one wall of the enclosure arranged to form a chamber and have a working opening for communication with the access opening of the data storage library, and to have at least one enclosure access opening in communication with the interior of the chamber and the exterior of the data storage library. The method may also include acclimating the interior of the enclosure to within a desired range of the desired environmental conditions of the interior of the data storage library, and accessing the interior of the data storage library through the access opening of the data storage library.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Figure 1A:
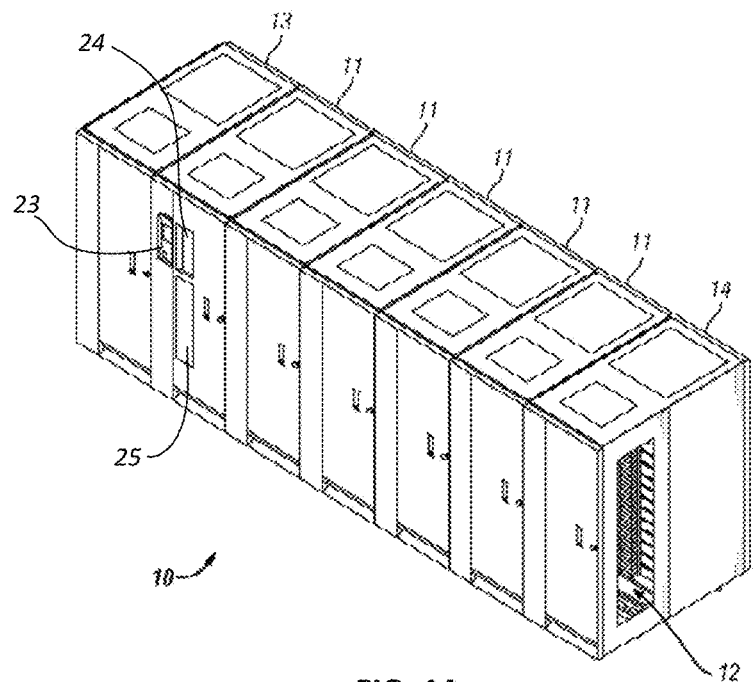
FIG. 1A is a perspective view of an automated data storage library according to one embodiment.
Figure 1B:
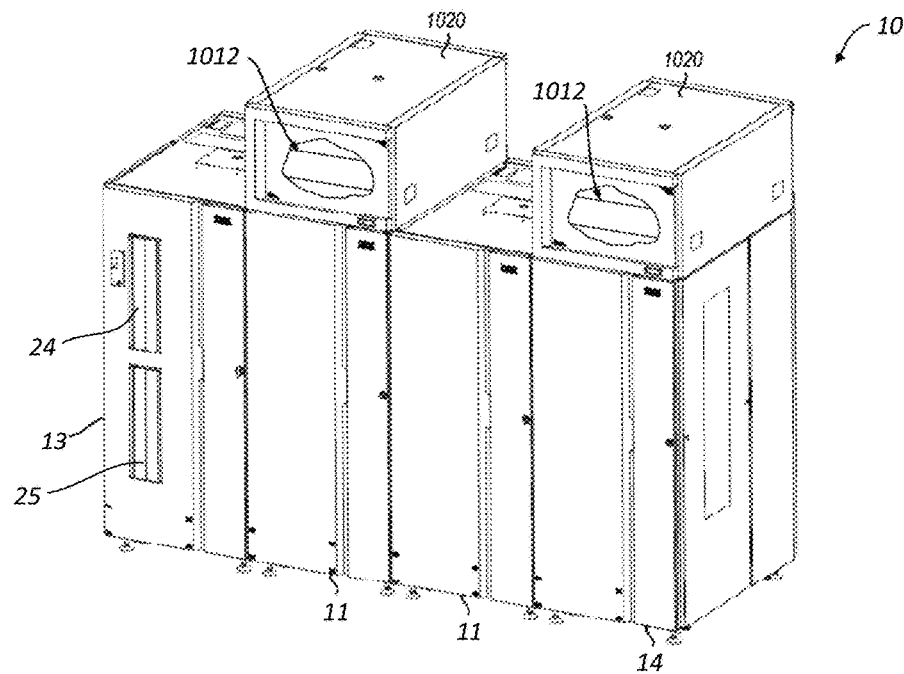
FIG. 1B is a perspective view of another embodiment of an automated data storage library.
Figure 2:
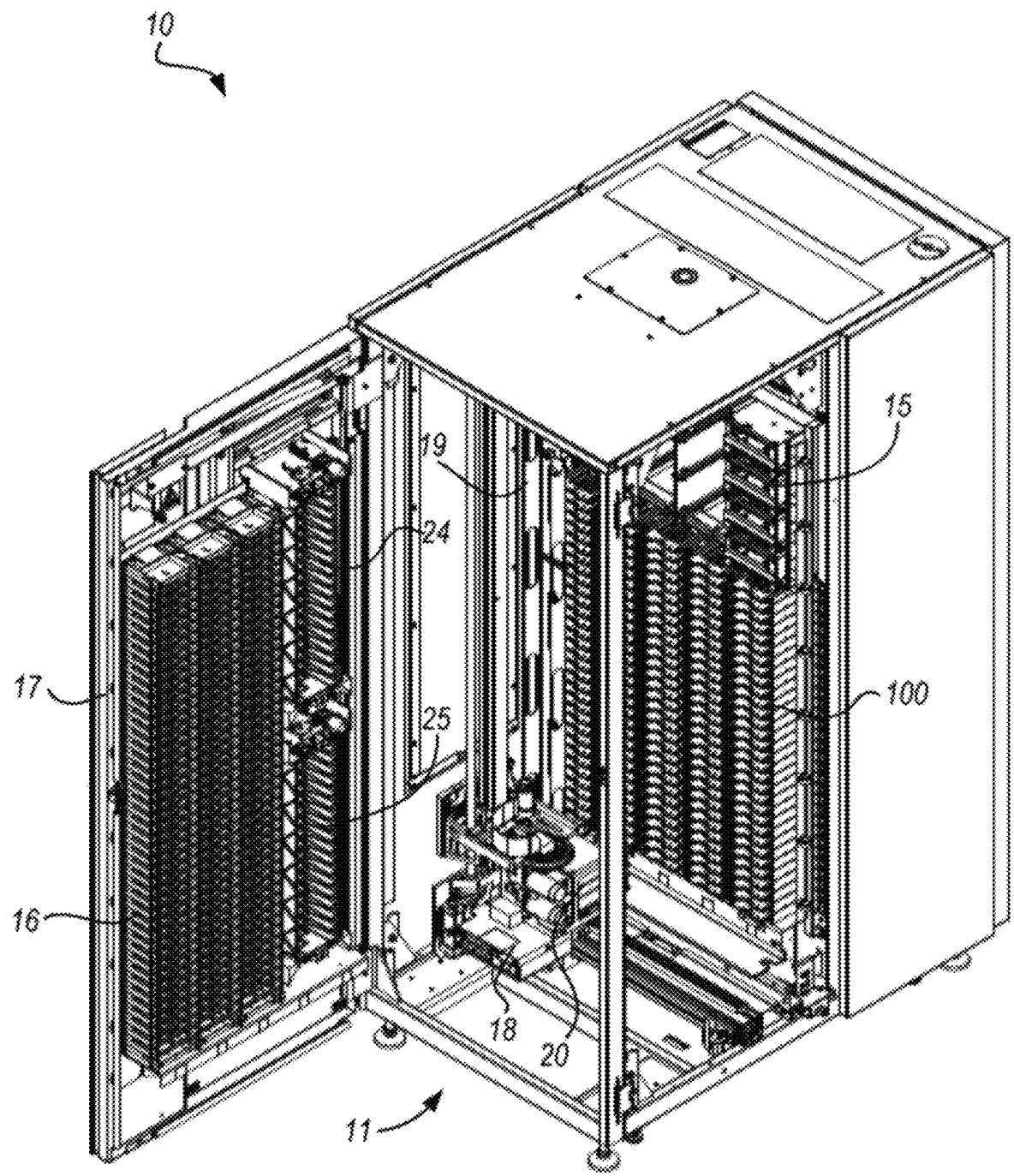
FIG. 2 is a perspective view of the interior of a storage frame from the data storage library of FIGS. 1A & 1B.

FIGS. 1A & 1B and FIG. 2 illustrate an example of a data storage system, e.g., an automated data storage library 10 which stores and retrieves data storage cartridges, containing data storage media (not shown), from multi-cartridge deep slot storage cells 100 and single cartridge storage slots 16. Examples of an automated data storage library which has a similar configuration as that depicted in FIG. 1A and FIG. 2, and may be implemented with some of the various approaches herein may include IBM TS4500 6Library or the IBM 3584 UltraScalable Tape Library.

The library 10 in the embodiment of FIG. 1A comprises a left hand service bay 13, one or more storage frames 11, and right hand service bay 14. The library 10 of FIG. 1B comprises a left handed service bay 13, one or more storage frames 11, a right handed service bay 14 and optional environmental conditioning units 1012 which may control the temperature, humidity and/or other environmental conditions in the interior of the library 10. While two environmental conditioning units are shown in FIG. 1B, it will be appreciated that more or less environmental conditioning units 1012 may be associated with the library, and in circumstances the library may have no environmental conditioning units. As will be discussed in further detail below, a frame may comprise an expansion component of the library. Thus, storage frames may be added or removed to expand or reduce the size and/or functionality of the library. According to different approaches, frames may include additional storage slots, deep storage slot cells, drives, import/export stations, accessors, operator panels, controller cards, communication cards, etc. Moreover, an accessor aisle 12 preferably extends between the storage frames and bays of the embodiments in FIGS. 1A & 1B thereby allowing an accessor to move between frames. A movable and/or deployable panel 21 may be displaced to cover and/or block (as well uncover and/or unblock) aisle 12 from communicating with the exterior of the data storage library. Panel 21 may be moved and/or removed to permit access to the interior of the service bays 13, 14. Panel 21 may be a window to permit visibility into the library 10. Herein, library frame may refer to an expansion frame or expansion module of an expandable library, or it may refer to part or all of a nonexpandable library.

FIG. 2 shows an exemplary embodiment of a storage frame 11, which may act as the base frame and/or the minimum configuration of the library 10. The storage frame 11 illustrated in FIG. 2 may have only a single accessor 18 (i.e., there are no redundant accessors) and no service bay. However, in other embodiments, a storage frame may include multiple robotic accessors and/or service bays.

Looking to FIG. 2, the library 10 is arranged for accessing data storage media in response to commands from at least one external host system (not shown). The library 10 includes a plurality of storage slots 16 on front wall 17 and a plurality of multi-cartridge deep slot cells 100 on rear wall 19, both of which may be used for storing data storage cartridges that may contain data storage media. According to one approach, the storage slots 16 are configured to store a single data storage cartridge, and the multi-cartridge deep slot cells 100 are configured to store a plurality of data storage cartridges. The arrangement and positioning of the storage slots 16 and the deep slot cells 100 may be different than illustrated in FIG. 2.

With continued reference to FIG. 2, the storage frame 11 of the library 10 also includes at least one data storage drive 15, e.g., for reading and/or writing data with respect to the data storage media in the data storage cartridges. Additionally, a first accessor 18 may be used to transport data storage cartridges containing data storage media between the plurality of storage slots 16, the multi-cartridge deep slot cells 100, and/or the data storage drive(s) 15. According to various approaches, the data storage drives 15 may be optical disk drives, magnetic tape drives, or other types of data storage drives that are used to read and/or write data with respect to the data storage media.

As illustrated, the storage frame 11 may optionally include an operator panel or other user interface, such as a web-based interface, which allows a user to interact with the library 10. Optionally, the library 10 may have an associated software application having a user interface, which also allows a user to interact with the library 10. The software application may be executable on a computing device, a remote server, a cloud or a mobile device.

Figure 3:
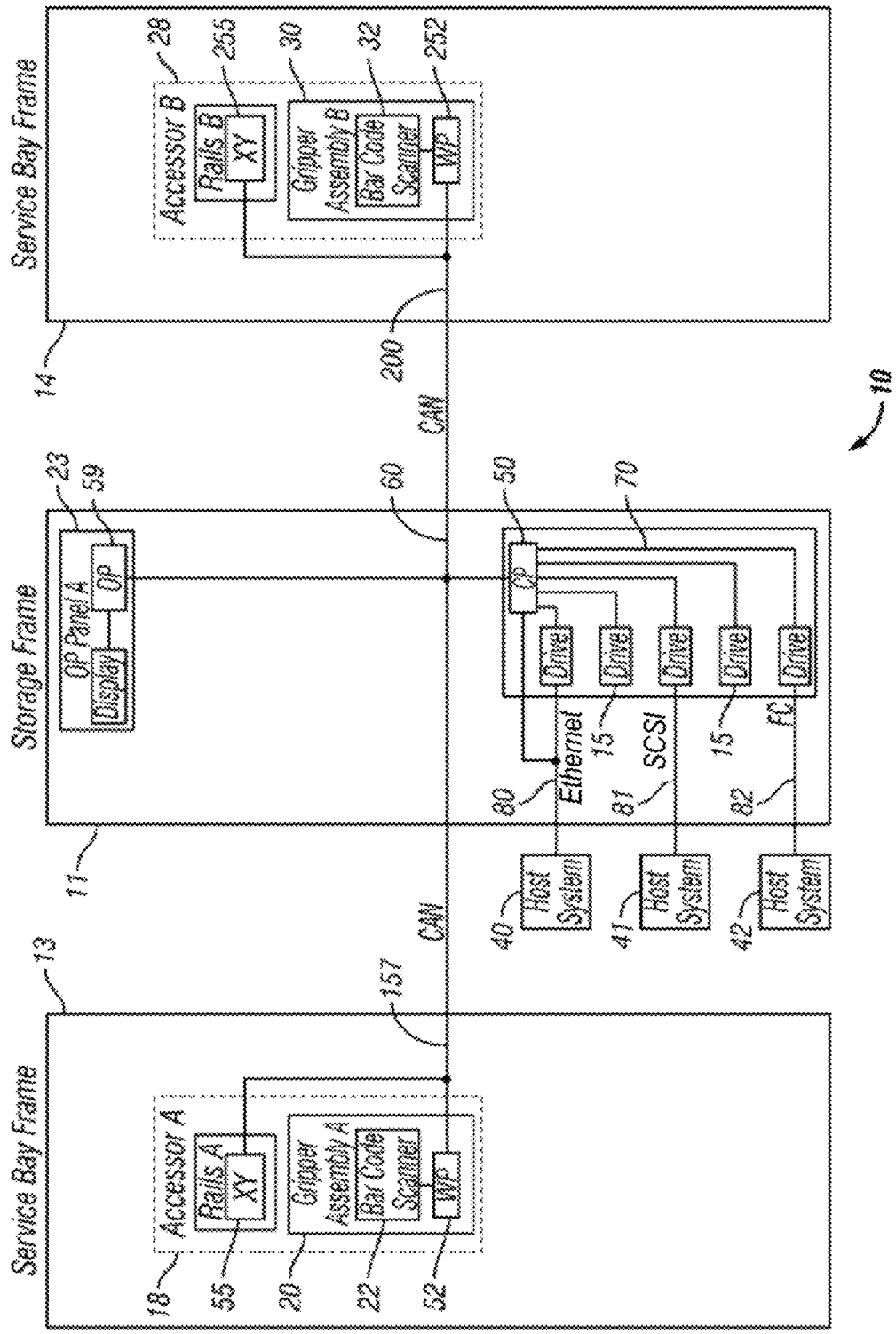
FIG. 3 is a schematic diagram of an automated data storage library according to one embodiment.

Referring now to FIG. 3, the automated data storage library 10 as described in reference to FIGS. 1A & 1B and FIG. 2, is depicted according to one embodiment. According to a preferred approach, the library 10 may employ a controller, e.g., arranged as a distributed system of modules with a plurality of processor nodes.

In one approach, the library is controlled, not by a central controller, but rather, by a distributed control system for receiving logical commands and converting the commands to physical movements of the accessor and gripper, and for operating the drives in accordance with the desired physical movements. The distributed control system may also provide logistical support, such as responding to host requests for element status, inventory, library status, etc. The specific commands, the conversion of those commands to physical movements of the accessor, gripper, controllers, and other components, and the operation of the drives may be of a type known to those of skill in the art.

While the automated data storage library 10 has been described as employing a distributed control system, various other approaches described and/or suggested herein may be implemented in automated data storage libraries regardless of control configuration, such as, but not limited to, an automated data storage library having one or more library controllers that are not distributed.

With continued reference to FIG. 3, library 10 receives commands from one or more host systems 40, 41, 42. The host systems 40, 41, 42, such as host servers, communicate with the library directly, e.g., on line 80 (e.g., path), through one or more control ports (not shown), or through one or more data storage drives 15 on paths 81, 82. Thus, in different approaches, the host systems 40, 41, 42 may provide commands to access particular data storage cartridges and move the cartridges, for example, between the storage slots 16, the deep slot cells 100, and the data storage drives 15. The commands are typically logical commands identifying the data storage cartridges or data storage cartridge media, and/or logical locations for accessing the media. Furthermore, it should be noted that the terms "commands" and "work requests" are used interchangeably herein to refer to such communications from the host system 40, 41, 42 to the library 10 as are intended to result in accessing particular data storage media within the library 10 depending on the desired approach.

According to one embodiment, the library 10 may be controlled by a library controller. Moreover, in various approaches, the library controller may include a distributed control system receiving the logical commands from hosts, determining the required actions, and/or converting the actions to physical movements of the first and/or second accessors 18, 28 and/or gripper assemblies 20, 30. In another approach, the distributed control system may have a plurality of processor nodes, each having one or more computer processors. According to one example of a distributed control system, a communication processor node 50 may be located in a storage frame 11. The communication processor node provides a communication link for receiving the host commands, either directly or through the drives 15, via at least one external interface, e.g., coupled to line 80.

As illustrated in FIG. 3, the communication processor node 50 is coupled to each of the data storage drives 15 of a storage frame 11, via lines 70, and may communicate with the drives 15 and with host systems 40, 41, 42. Alternatively, the host systems 40, 41, 42 may be directly coupled to the communication processor node 50, at line 80 (e.g., input) for example, or to control port devices (not shown) which connect the library to the host system(s) with a library interface similar to the drive/library interface. As is known to those of skill in the art, various communication arrangements may be employed for communication with the hosts and with the data storage drives. In the example of FIG. 3, lines 80 and 81 are intended to be Ethernet and a SCSI bus, respectively, and may serve as host connections. However, path 82 comprises an example of a Fibre Channel bus which is a high speed serial data interface, allowing transmission over greater distances than the SCSI bus systems.

According to some approaches, the data storage drives 15 may be in close proximity to the communication processor node 50, and may employ a short distance communication scheme, such as Ethernet, or a serial connection, such as RS-422. Thus, the data storage drives 15 may be individually coupled to the communication processor node 50 by lines 70. Alternatively, the data storage drives 15 may be coupled to the communication processor node 50 through one or more networks.

Furthermore, additional storage frames 11 may be provided, whereby each is preferably coupled to the adjacent storage frame. According to various approaches, any of the additional storage frames 11 may include communication processor nodes 50, storage slots 16, storage cells 100, data storage drives 15, networks 60, etc.

An automated data storage library 10 typically comprises one or more controllers to direct the operation of the automated data storage library. Moreover, host computers and data storage drives typically include similar controllers. A library controller may take many different forms and may comprise, for example, but is not limited to, an embedded system, a distributed control system, a personal computer, a workstation, etc. The term "library controller" as used herein is intended in its broadest sense as a device that includes at least one processor, and optionally further circuitry and/or logic, for controlling and/or providing at least some aspects of library operations.

Figure 4:
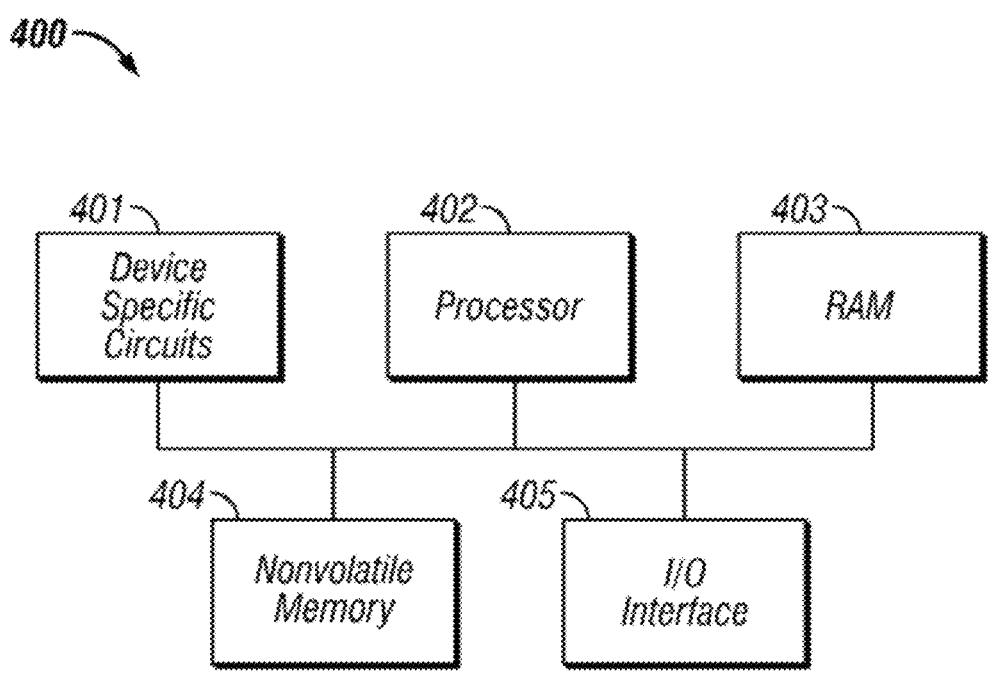
FIG. 4 is a block diagram depicting a controller configuration according to one embodiment.

Referring now to FIG. 4, a typical controller 400 is shown with a processor 402, Random Access Memory (RAM) 403, nonvolatile memory 404, device specific circuits 401, and I/O interface 405. Alternatively, the RAM 403 and/or nonvolatile memory 404 may be contained in the processor 402 as could the device specific circuits 401 and I/O interface 405. The processor 402 may comprise, for example, an off-the-shelf microprocessor, custom processor, Field Programmable Gate Array (FPGA), Application Specific Integrated Circuit (ASIC), discrete logic, etc. The RAM 403 is typically used to hold variable data, stack data, executable instructions, etc.

According to various approaches, the nonvolatile memory 404 may comprise any type of nonvolatile memory such as, but not limited to, Electrically Erasable Programmable Read Only Memory (EEPROM), flash Programmable Read Only Memory (PROM), battery backup RAM, hard disk drives, etc. However, the nonvolatile memory 404 is typically used to hold the executable firmware and any nonvolatile data containing programming instructions that can be executed to cause the processor 402 to perform certain functions.

In some embodiments, the I/O interface 405 may include a communication interface that allows the processor 402 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The controller 400 may communicate with an external device via the communication interface 405 in any communication protocols such as Automation/Drive Interface (ADI).

The device specific circuits 401 provide additional hardware to enable the controller 400 to perform unique functions including, but not limited to, motor control of an accessor cartridge gripper. Moreover, the device specific circuits 401 may include electronics that provide, by way of example but not limitation, Pulse Width Modulation (PWM) control, Analog to Digital Conversion (ADC), Digital to Analog Conversion (DAC), etc. In addition, all or part of the device specific circuits 401 may reside outside the controller 400.

While the automated data storage library 10 is described as employing a distributed control system, the various approaches described and/or suggested herein may be implemented in various automated data storage libraries regardless of control configuration, including, but not limited to, an automated data storage library having one or more library controllers that are not distributed. Moreover, a library controller may comprise one or more dedicated controllers of a library, depending on the desired embodiment. For example, there may be a primary controller and a backup controller. In addition, a library controller may comprise one or more processor nodes of a distributed control system. According to one example, communication processor node 50 (e.g., of FIG. 3) may comprise the library controller while the other processor nodes (if present) may assist the library controller and/or may provide backup or redundant functionality. In another example, communication processor node 50 and work processor node 52 may work cooperatively to form the library controller while the other processor nodes (if present) may assist the library controller and/or may provide backup or redundant functionality. Still further, all of the processor nodes may comprise the library controller. According to various approaches described and/or suggested herein, a library controller may have a single processor or controller, or it may include multiple processors or controllers, or multiple cores in a processor chip.

Figure 5:
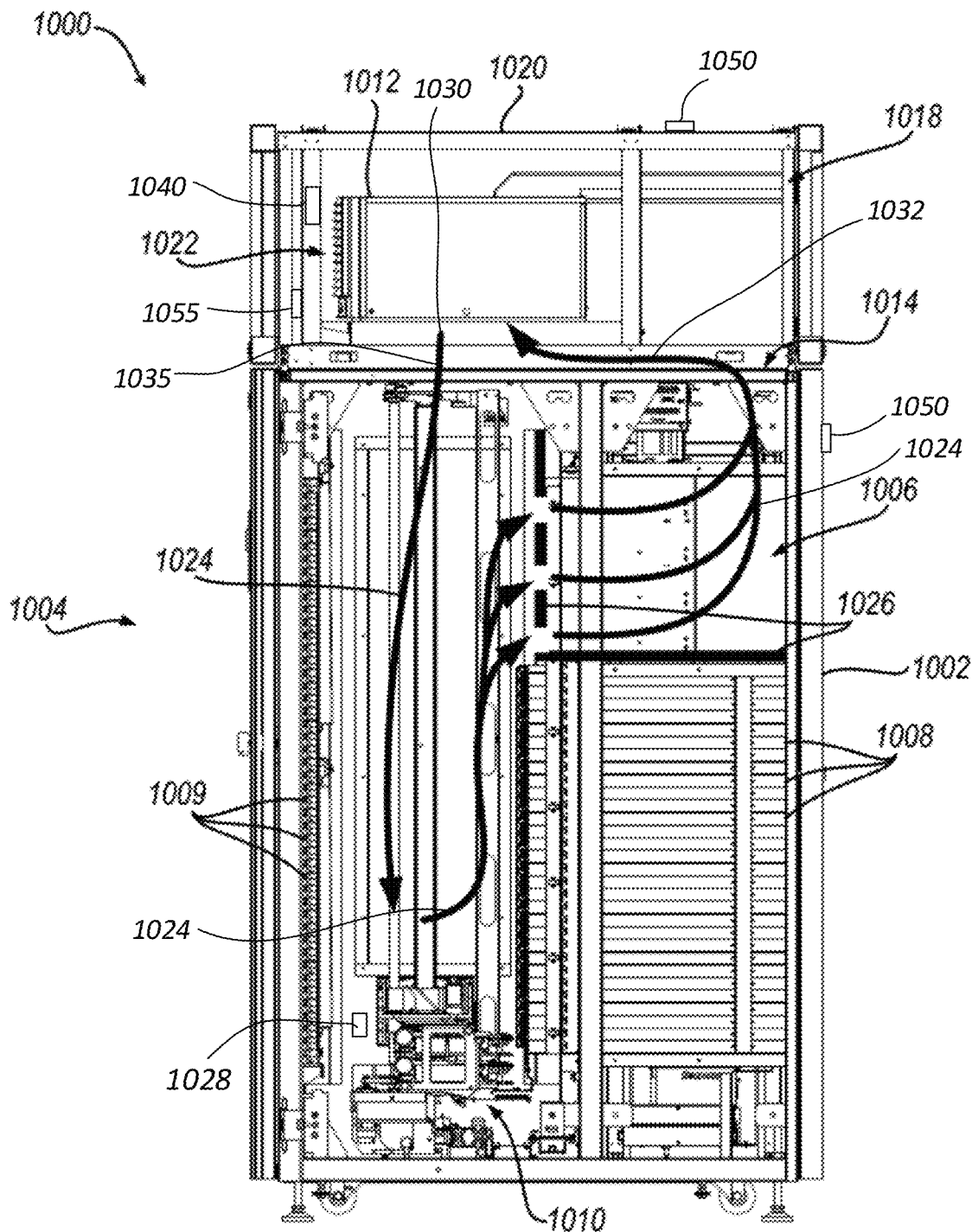
FIG. 5 is a partial side view of a system for storing magnetic recording media, in accordance with one embodiment.

Referring now to FIG. 5, a system 1000 includes a frame 1002 of an automated data storage library 1004. As described above, automated data storage libraries are typically used to store cartridges and drives in large arrays to store large amounts of data. Thus, an interior of frame 1002 is illustrated as a tape library in one embodiment, and is depicted as including one or more tape drives 1006, an area for storing tape cartridges (e.g., multi-cartridge deep slot cells 1008 and single cartridge storage slots 1009), and a robotic accessor 1010, among other components which would be apparent to one skilled in the art upon reading the present description (e.g., see FIG. 2 above).

System 1000 further includes an optional environmental conditioning unit 1012 associated with the frame 1002. The environmental conditioning unit 1012 may be integrated with and coupled to frame 1002. For the purposes of the present disclosure, it is to be understood that an environmental conditioning unit may be any device which conditions the air and/or the surrounding environment and is able to change one or more environmental conditions. The environmental conditions may include (but are not limited to) temperature, humidity, pressure, etc. In one embodiment, the environmental conditioning unit may be an air-conditioning unit. In other embodiments, the environmental conditioning unit may be a thermo-electric heater, a thermo-electric cooler, an electric heater, a liquid heater, a liquid cooler, a heat pump, an evaporative cooler, an ionizer, a de-ionizer, a humidifier, a dehumidifier, one or more fans, or any combination thereof. An environmental conditioning unit in accordance with one embodiment of the present disclosure may increase or decrease the temperature, humidity, pressure, etc. The environmental conditioning unit 1012 may be coupled to an upper surface 1014 (e.g., the roof) of the frame 1002 as shown in FIG. 1B and FIG. 5. The environmental conditioning unit 1012 preferably operates without negatively affecting the operating conditions in the frame 1002. Alternatively, an environmental conditioning unit may be functionally associated with the frame 1002 by positioning the environmental conditioning unit elsewhere and using ducts to route the air to the interior of the frame 1002, coupling the environmental conditioning unit to a side of the frame 1002, coupling the environmental conditioning unit to a bottom of the frame 1002 (underneath the frame 1002), etc., depending on the desired approach.

The environmental conditioning unit 1012 is preferably configured such that it may adjust, change and/or regulate the relative conditions (e.g., temperature, humidity, contaminant presence via filtering, etc.) inside the frame 1002. Thus, according to different approaches, the environmental conditioning unit may be able to reduce the temperature of the interior of the frame 1002 and/or reduce the relative humidity of the interior of the frame 1002, depending on the type of environmental conditioning unit 1012 employed. The environmental conditioning unit 1012 is preferably configured to turn on and off as desired to maintain a selected environment (e.g., temperature and/or humidity) in the interior of the frame 1002. Alternatively, the environmental conditioning unit may have a fan and the fan can be left always on to keep air circulating within the interior of the frame. In one embodiment, the environmental conditioning unit may be an air conditioning unit and the fan may be continuously on and the compressor may turn on and off to maintain a selected temperature and/or humidity in the interior of the frame 1002.

As would be appreciated by one skilled in the art, the environmental conditioning unit 1012 may be an air conditioning unit and may be able to adjust the relative temperature and/or humidity of the interior of the frame 1002 in a conventional manner. Cold air may flow into the interior of the frame 1002 via an inlet air duct 1030 which may connect the environmental conditioning unit 1012 to the interior of the frame 1002, and form an inlet 1035 in the upper surface 1014 of the frame 1002. Specifically, an inlet air duct 1030 may direct the air cooled by the environmental conditioning unit 1012 into the interior of the frame 1002, e.g., where the majority of the data storage media may be stored. As a result, air flow is created from the environmental conditioning unit 1012 to the interior of the frame 1002, as indicated by arrows 1024. This air flow may be induced by a fan included in the environmental conditioning unit 1012 and/or by using the fans in the one or more tape drives 1006 in the frame 1002. Although the air flow is preferably directed from the environmental conditioning unit 1012 to the interior of the frame 1002, and from the interior of the frame 1002 back to the environmental conditioning unit 1012, the particular path that the air flow is shown as extending along in the present embodiment by arrows 1024 is in no way intended to limit the disclosure or the invention. For example, rather than recirculating air from within automated data storage library 1004, air may be drawn in from outside automated data storage library 1004, cooled by the environmental conditioning unit 1012, and then forced out vents, cracks or openings (not shown) in automated data storage library 1004. This would have the effect of creating a positive pressure within automated data storage library 1004, to help prevent unconditioned air from leaking inside the library in the event that seals are not used or a door, panel, hatch, etc. is opened for accessing the interior of automated data storage library 1004, and it would also permit a greater area of recirculation (beyond the interior of automated data storage library 1004), as will be discussed.

With continued reference to FIG. 5, system 1000 may include an enclosure 1020 for the environmental conditioning unit 1012. An additional fan 1040 may be included in the enclosure 1020 for passing ambient air over external components of the environmental conditioning unit 1012 to further promote heating, cooling and/or conditioning of the air (e.g., to exhaust waste air). Moreover, the enclosure 1020 may include an opening, a baffle or baffles, etc. to direct ambient air exterior to the library 1004 toward an inlet 1022 of the environmental conditioning unit 1012.

In one embodiment, any vents, voids, seams, etc. in the frame 1002 of the library 1004, other than inlet 1035 and an outlet 1032 in an upper surface 1014 of the frame 1002, are preferably sealed such that air from outside the frame 1002 is restricted from entering the interior thereof. The frame 1002 may be sealed using any processes which would be apparent to one skilled in the art upon reading the present description, e.g., including but not limited to inserting foam, implementing insulating seals, etc. New frames may be built without any vents, voids, seams, etc. The housing and panels enclosing the frame 1002 may also be insulated to prevent or inhibit unconditioned air from entering the frame 1002.

The frame 1002 may also include one or more environmental sensors 1050 exterior to the library 1004 and may also include one or more sensors 1055 exterior to the library 1004 but inside the enclosure 1020 for the environmental conditioning unit 1012. In one embodiment the sensors 1055 may be located in front of inlet 1022 of the environmental conditioning unit 1012. The environmental sensors 1050, 1055 may be any sensor appropriate for determining the environmental conditions at the sensor location, such as one or more temperature sensors, one or more humidity sensors, one or more pressure sensors, etc. The one or more environmental sensors 1050, 1055 may be in communication with a library controller, such as library controller 400 shown and described with respect to FIG. 4 and/or environmental conditioning unit 1012. The one or more signals provided by the environmental sensors 1050, 1055 may be utilized to control the output and operation of the environmental conditioning unit 1012. Although the embodiment illustrated in FIG. 5 includes a single frame 1002 and a single environmental conditioning unit 1012, other embodiments may include additional frames and/or environmental conditioning units.

System 1000 illustrated in FIG. 5 may further comprise one or more environmental sensors 1028 disposed within the interior of the library 1002. The environmental sensor(s) may be any appropriate sensor for determining the environmental conditions within the frame 1002, such as one or more temperature sensors, one or more humidity sensors, one or more pressure sensors, etc. The one or more environmental sensors 1028 may be in communication with a library controller, such as controller 400 shown and described with respect to FIG. 4 and/or environmental conditioning unit 1012. As such, the signal provided by the one or more environmental sensors 1028 may be utilized to control the output and operation of the environmental conditioning unit 1012.

Although the embodiment illustrated in FIG. 5 includes a single frame 1002 and a single environmental conditioning unit 1012, other embodiments may include additional frames and/or environmental conditioning units.

While a data storage library having an associated and/or integrated environmental conditioning unit advantageously controls the environmental conditions within the library, some challenges may exist when components within such a data storage library need to be serviced or replaced. As noted above, many data centers are now maintained at higher temperatures and higher humidity levels to reduce the costs relating to cooling the environment where the data storage library is located, e.g., the data center. For this reason, environmental conditions of the data center may be substantially different from those within a data storage library having an associated environmental conditioning unit which controls the environmental conditions within the data storage library. As such, a component (e.g., a data storage drive, data storage cartridge, library control card, communication cards, etc.) that is moved abruptly from, for example, the cool, dry environment of the data storage library to the warm, humid environment of the data center may cause condensation to form on surfaces thereof. Additionally, opening a door at an access opening to the data storage library may also introduce air from the data center into the conditioned environment of the data storage library, potentially causing the formation and accumulation of condensation on various surfaces within the data storage library. Moisture build-up on surfaces of sensitive components such as data storage cartridges and tape drives is undesirable, as moisture may lead to equipment damage, up to and including failure of the components and/or data loss. A library access opening may be covered or blocked by a movable panel. Herein, a movable panel may comprise a door, a magazine, an I/O station port, a service panel, a plate, a hatch, a flap, a cover, a wall, a floor, a ceiling, a panel, an air curtain or any other structure or mechanism that may cover an opening, or provide access, to the interior of the library.

Thus, in accordance with aspects of the disclosure, an apparatus, for example an enclosure, is provided that may be configured, arranged, and transformable to at least partially surround a data storage library. The data storage library may comprise an associated environmental conditioning unit (e.g., an air conditioning unit). The enclosure may be configured to substantially acclimate to the environmental conditions found within the library frames of the data storage library. The enclosure may permit an access door, access panel, and/or barrier of the data storage library to be opened (at an access opening of the library) in a manner that inhibits, resists, and/or prevents an influx of air from the surrounding data center into the interior of the data storage library. Herein, a library access panel may include a movable panel. The enclosure may resist, inhibit, and/or prevent thermal shock and/or other undesirable environmental conditions (e.g., air contaminants, condensation formation and/or accumulation on sensitive componentry, etc.) during insert or removal of media, service and/or maintenance procedures due to wide variations in environmental conditions between the interior of the data storage library and the exterior data center. Herein, servicing the library and a service procedure may comprise inserting and/or removing of data storage cartridges, repair or replacement of library components, installation of new components, preventative maintenance and/or performing testing of part or all of the library. Herein, technician, may comprise a service person, a support person, a library operator, a library administrator, a user, or any other person (or human adult) that requires access to the interior of the library and the terms may be used interchangeably.

Figure 6:
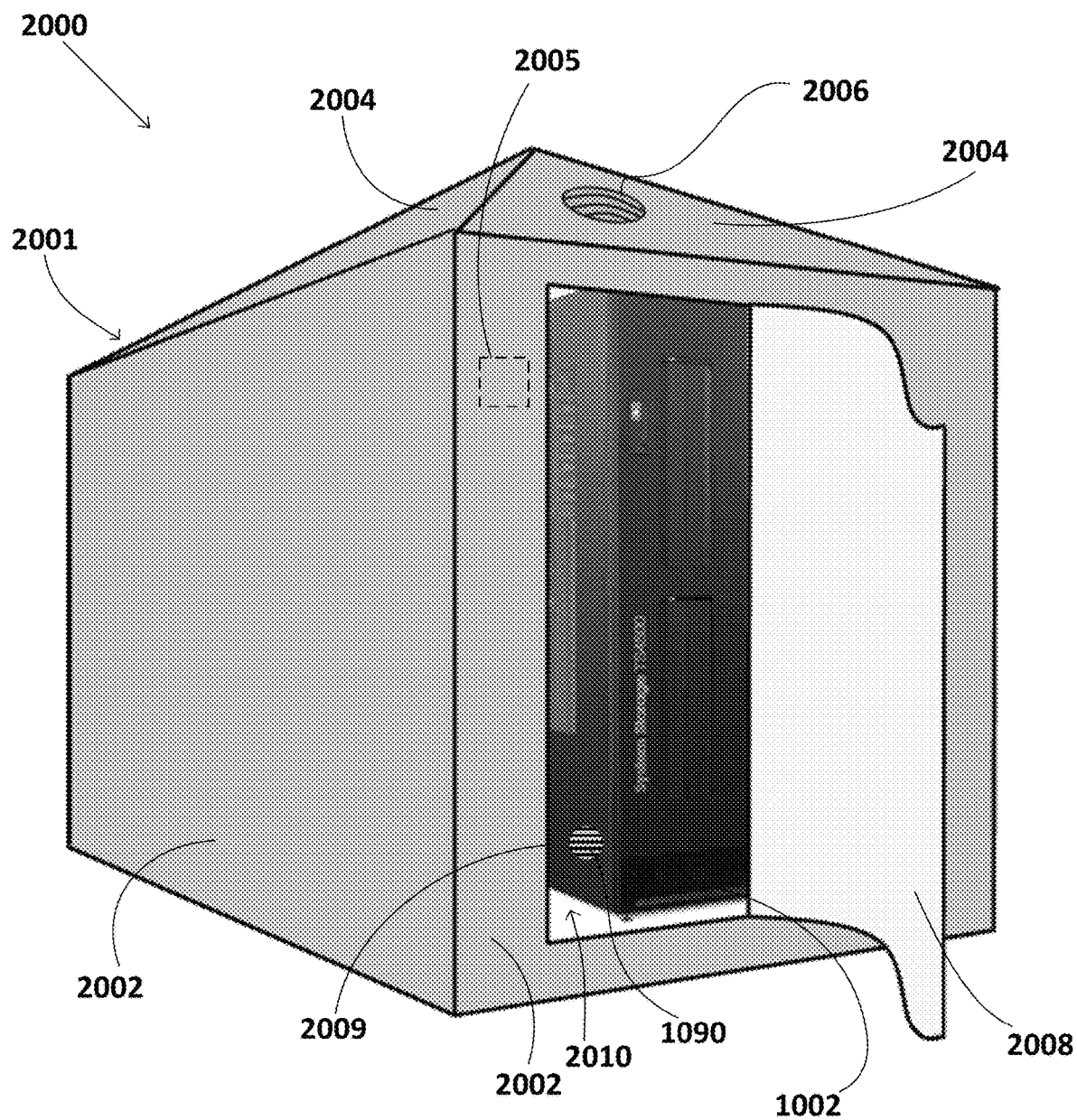
FIG. 6 is a perspective view of a data storage library and enclosure in accordance with one aspect.

Referring to FIG. 6, a service access system 2000 in accordance with an aspect of the present disclosure is illustrated. Service access system 2000 comprises an enclosure 2001 configured to substantially surround a data storage library frame(s) 1002, such as that described above with respect to FIG. 5. While FIG. 6 only shows library frame 1002 comprising a single library frame, it is to be understood that library frame 1002 may comprise a plurality of frames, such as that which is illustrated in FIGS. 1A-1B. Library frame(s) 1002 may comprise conventional data storage library componentry, similar to that which is found in library 10 described above with respect to FIG. 2. For instance, one or more of library frames 1002 may comprise a plurality of storage slots to hold data storage cartridges associated with data storage media, one or more data storage drives to read and/or write data associated with the media associated with the data storage cartridges, and one or more robotic accessors. Furthermore, while not shown in FIG. 6, data storage library frame(s) 1002 may be associated and/or equipped with one or more environmental conditioning units, such as that which is described above with respect to data storage library 10 in FIG. 1B and 1004 in FIG. 5. The environmental conditioning unit(s) may control one or more environmental conditions (e.g., temperature and/or humidity) within the library frame(s) 1002. In one embodiment, it is contemplated that the data storage library will be a tape library which may include tape cartridges, tape drives, and accessors.

As noted above, service access system 2000 comprises an enclosure 2001 adapted and configured to substantially and/or entirely surround the data storage library frame(s) 1002 and preferably permits access to the data storage library in a manner that separates, insulates, and/or isolates environmental conditions from the exterior of the data storage library from intruding into the data storage library during insert or removal of media, a service, upgrade and/or maintenance procedure. Enclosure 2001 may comprise one or more side wall(s) or panels 2002. Enclosure 2001 may include at least one top panel 2004 disposed over the top surface of data storage library 1002 (and any associated environmental conditioning unit(s), such as environmental conditioning unit 1012 shown within enclosure 1020 in FIGS. 1B and 5). Enclosure 2001 may have a tent-like structure, with the capability of being easily and quickly installed (and/or uninstalled) to substantially surround a data storage library 1002. The side wall panels 2002 may be self-supporting, or may be held by a collapsible and/or removable framework structure (not shown). The framework structure may be formed of any appropriate material, such as, for example, a plurality of fiberglass, carbon fiber, aluminum, or para-aramid synthetic fiber poles, brackets, extensions, etc. Furthermore, the bottom portion of enclosure 2001 may include a plurality of wheels or slidable structures thereon in order to aid in the movement and portability of enclosure 2001. The framework structure may be broken down so as to enable the enclosure 2001 to be portable and storable when not in use. Additionally, the framework structure may comprise a plurality of spring-biased joints, enabling the structure to automatically erect when opened. While shown surrounding library frame(s) 1002 in FIG. 6, it is to be understood that enclosure 2001 may or may not be erected alone and may not require the presence of one or more library frames 1002 in order to maintain shape and form.

Enclosure 2001 may be formed of any suitable material, such as nylon, polyester, canvas, cotton, silk, plastic, foil, a para-aramid synthetic fiber (e.g., KEVLAR®), or any other flexible material. The material preferably provides a barrier to environmental conditions. In one embodiment, the enclosure resists, inhibits, and/or prevents environmental conditions outside the enclosure from intruding and/or infiltrating into the interior chamber formed by the enclosure. In another embodiment, the enclosure 2001 is capable of providing and maintaining stable environmental conditions within the enclosure 2001. In yet another embodiment, the enclosure 2001 may be substantially sealable. Additionally and/or alternatively, enclosure 2001 may comprise multiple layers of multiple materials, either alike or different, so as to provide varying degrees of insulating properties, if needed. One or more layers of material of enclosure 2001 may be an insulation layer. Furthermore, at least a portion of enclosure 2001 may be formed of a substantially water-resistant or waterproof material.

At least one closable access door 2008 may be provided on at least one of side wall panel(s) 2002 so as to allow an access opening by an operator into the interior chamber 2010 formed by enclosure 2001. Access door 2008 may be made of the any suitable material or combination of materials, and they may be the same or different materials than enclosure 2001, such as, for example, nylon, polyester, canvas, cotton, silk, plastic, foil, a para-aramid synthetic fiber (e.g., KEVLAR®), or any other flexible material. In one embodiment, the access door 2008 may be selectively openable and closable. When open, access door 2008 provides an access opening 2009 preferably of sufficient size to permit a technician (human adult) access to the interior chamber 2010 of the enclosure 2001. Furthermore, access door 2008 may be configured as a hinged door (e.g., an office door, cabinet door, etc.), hinged flap (e.g., a non-zippered door to a camping tent), a zippered door (e.g., a zippered camping tent door), one or more vertically-hanging slats or flaps (e.g., a door to a high-traffic cold storage room), a split membrane (e.g., a flexible slot or hole that remains closed until forced open), an air curtain (e.g., a high-traffic store front that uses a wall of forced air to create an environmental barrier), a sliding panel (e.g., a sliding closet door, a pocket door, etc.), a rolled door (e.g., rolling blinds, rolled security door, etc.), or any other appropriate closure capable of allowing selective access, yet allowing closure in order to provide a barrier between the environment within enclosure 2001 and the environment outside the enclosure 2001.

When access door 2008 is closed, enclosure 2001 may form a chamber having environmental conditions around library frame(s) 1002, either encompassing all of the library frame(s) 1002, or at least those portions of library frame(s) 1002, where a technician may gain access to the interior of frame(s) 1002. The chamber 2010 formed by enclosure 2001 may be brought to the same or similar environmental condition(s) as the interior environmental conditions of library frame(s) 1002 in one embodiment via communication with the conditioned air provided to the interior of frame(s) 1002. For example, frame(s) 1002 may have one or more vents 1090 capable of transferring conditioned air from within frame(s) 1002 externally, thereby providing the conditioned air into the interior of enclosure 2001 and/or circulating return air from the interior of enclosure 2001. Alternatively, vent(s) 1090 may be coupled directly to the input (return air) and/or output (supply air) of the environmental conditioning unit without first going through the interior of frame(s) 1002. If adjustable, vent(s) 1090 may be selectively opened and closed, either manually (e.g., by a technician moving a vent closure, as a result of a technician closing access door 2008, etc.) or automatically (e.g., using actuators or motors under the control of a library controller, a dedicated enclosure controller, under the control of an environmental conditioning unit, etc.), to communicate conditioned air into enclosure 2001. Alternatively and/or additionally, one or more portals or doors may be provided in library frame(s) 1002 to allow conditioned air from within the library frame(s) 1002 to reach the enclosure 2001.

Furthermore, library frame(s) 1002 may naturally leak a certain amount of conditioned air during operation that would effectively condition the air within enclosure 2001, even without dedicated vent(s), portal(s), door(s), opening(s), etc. This may be especially true if the environmental conditioning unit is configured to generate a positive pressure inside the automated data storage library by drawing the intake air from outside the library (e.g., the air intake comes from within enclosure 2001, the air intake comes from outside enclosure 2001 and from outside the library, etc.). Enclosure 2001 may also utilize one or more environmental condition sensors 2005 (e.g., temperature and/or humidity sensors) so as to monitor the environmental conditions within the enclosure 2001. Measurements, readings, and/or signals from the one or more environmental condition sensors 2005 may be provided to a controller (e.g., a library controller such as controller 400 shown and described with respect to FIG. 4, a dedicated enclosure controller, etc.), may be provided to an environmental conditioning unit (such as environmental conditioning unit 1012 shown and described with respect to FIG. 5), and/or may be provided to a display (not shown) such that the operator may visually determine the environmental conditions within the enclosure 2001. If readings are supplied to a controller, the controller may make a comparison between the sensors inside the library and inside the enclosure and provide a visual, audible, or other alert when access to the library may be made. Alternatively, enclosure 2001 may comprise no environmental condition sensors, and an operator or service technician may rely solely on the passage of time or operator judgement to determine when the desired environmental conditions (e.g., temperature and/or humidity) in the enclosure 2001 are the same, similar to, and/or within a desired range as the corresponding environmental condition(s) within library frame(s) 1002. For example, the technician may wait twenty-four (24) hours after setting up the enclosure before servicing the library frame(s). The technician may wait more or less than twenty-four (24) hours; which may depend upon a number of factors.

The enclosure 2001 in FIG. 6 is configured and adapted to substantially and/or entirely surround the data storage library. Optionally, the enclosure may also provide a chamber of sufficient size to permit the technician to enter the interior 2010 of the enclosure 2001 through the access door 2008 and close the access door 2008 while the technician (human adult) is inside the enclosure 2001. The chamber is preferably of sufficient size that the technician can move and/or open the desired access panels and/or doors of the data storage library while within the enclosure 2001, and preferably has sufficient room to insert or remove media, provide repair services, upgrades and/or maintenance on the library.

While not shown in FIG. 6, library frame(s) 1002 may comprise or have at least one environmental conditioning unit 1012, such as those shown in FIGS. 1B and 5. It may be desirable to provide active venting (i.e., venting that utilizes fans or forced air) or passive venting (i.e., no air movement devices) to the at least one environmental conditioning unit 1012, independent of the space inside enclosure 2001 (e.g., insulated or isolated from the air inside enclosure 2001). For example, the at least one associated and/or integrated environmental conditioning unit 1012 may comprise an air conditioner. Air conditioners generally comprises a heat exchanger, which emits waste heat therefrom. If enclosure 2001 were to fully enclose environmental conditioning unit 1012, the waste heat emitted by environmental conditioning unit 1012 may cause the environmental conditions within enclosure 2001 to become warmer, regardless of any communication with the interior environmental conditions of the library frame(s) 1002. In another example, the at least one environmental conditioning unit 1012 may comprise a heat pump which may produce cold waste air. Air conditioners, thermoelectric coolers, heat pumps, thermoelectric heaters are a few examples of environmental conditioning units that may produce waste air and thus benefit from venting. Thus, system 2000 may further comprise one or more vents 2006 capable of venting waste air from the environmental conditioning unit(s) 1012 out of enclosure 2001. The one or more vents 2006 may include and/or consist of rigid or flexible ducts. Alternatively and/or additionally, enclosure 2001 may provide direct exterior access to venting provided on the environmental conditioning unit(s) 1012 through one or more openings in the at least one top panel 2004 and/or side wall panel 2002. In this way, waste air from the environmental conditioning unit(s) 1012 is expelled directly to the exterior of the data storage library and the enclosure 2001 and does not affect the environmental conditions within enclosure 2001.

As enclosure 2001 may be maintained at the same (or substantially the same) environmental conditions as the interior of library frame(s) 1002, an operator may access the interior of library frame(s) 1002 for insert or removal of media, maintenance, component replacement, etc., without an influx of air from within the surrounding room (e.g., the data center) from entering the library frame(s) 1002. For example, the desired environmental conditions (e.g., temperature and/or humidity) within the enclosure 2001 may be acclimated to be at, near, or within the desired range of the corresponding environmental conditions (e.g., temperature and/or humidity) within library frame 1002, at which point the technician may open a movable panel to the library access opening thereby allowing access to the interior of the library. Since the enclosure serves as an environmental barrier to the environmental conditions outside the enclosure (and the data storage library), and since the conditions within the enclosure have been acclimated to the desired environmental conditions, the interior of the data storage library should not be exposed to environmental conditions from outside the enclosure 2001 (e.g. data room environmental conditions). In this way, enclosure 2001 may resist, inhibit, and/or prevent undesirable environmental conditions (e.g., air contaminants, the formation and/or accumulation of condensation on sensitive componentry, etc.) within library frame(s) 1002. Furthermore, enclosure 2001 may be temporarily erected when operator access into a particular library frame or frames is needed, and may be dismantled when access is no longer needed. As such, a single enclosure 2001 may be utilized for access and service of a group of separate libraries and/or library frame(s) 1002 at different times. The enclosure and/or access door 2008 may comprise a means for determining if the door is closed. For example, the access opening 2009 or access door 2008 may comprise a door switch or sensor that is coupled to a controller (such as library controller 400 shown and described with respect to FIG. 4), an environmental conditioning unit, and/or an audio or visual indicator. The switch or sensor may be used to alert a technician (or anyone that requires access to the interior of the library) that access door 2008 is open, it may be used to control the movement of conditioned air from library frame(s) 1002 into the chamber 2010, and/or it may be used to activate/deactivate an environmental conditioning unit. While flat sides and rectangular shapes are described and shown with respect to FIG. 6, enclosure 2001 may comprise other shapes and sides (e.g., circular, cylindrical, spherical, triangular, etc.).

Figure 7:
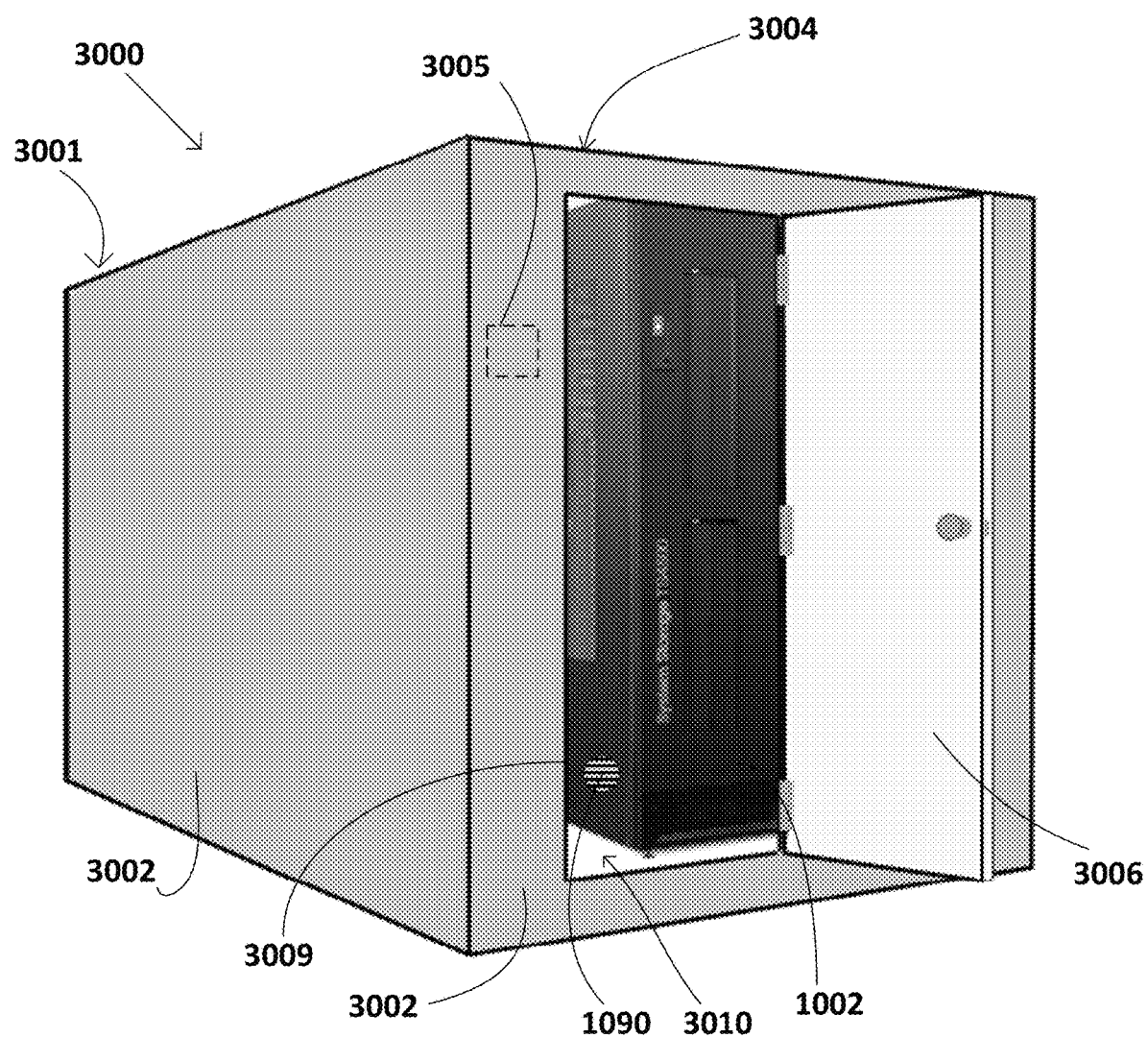
FIG. 7 is a perspective view of a data storage library and enclosure in accordance with another aspect.

Next, referring to FIG. 7, another embodiment of a service access system is disclosed. Service access system 3000, like service access system 2000 described above, comprises an enclosure 3001 at least partially surrounding a data storage library frame(s) 1002, such as that described above with respect to FIG. 5. While FIG. 7 only shows library frame 1002 comprising a single library frame, it is to be understood that library frame 1002 may comprise a plurality of frames, such as that which is illustrated in FIGS. 1A-1B. Library frame(s) 1002 may comprise conventional data storage library componentry, similar to that which is found in library 10 described above with respect to FIG. 2. For instance, one or more of library frames 1002 may comprise a plurality of storage slots to hold data storage cartridges associated with data storage media, one or more data storage drives to read and/or write data associated with the media associated with the data storage cartridges, and one or more robotic accessors. Furthermore, while not shown in FIG. 7, data storage library 1002 may be associated and/or equipped with one or more environmental conditioning units, such as that which is described above with respect to data storage library 10 in FIG. 1B and data storage library 1004 in FIG. 5. The environmental conditioning unit(s) may control one or more environmental conditions (e.g., temperature and/or humidity) within the library frame(s) 1002. In one embodiment, it is contemplated that the data storage library will be a tape library which may include tape cartridges, tape drives, and accessors.

Service access system 3000 comprises an enclosure 3001 adapted and configured to substantially and/or entirely surround the data storage library frame(s) 1002 and preferably permits access to the data storage library in a manner that separates, insulates, and/or isolates environmental conditions from exterior of the data storage library from intruding the data storage library during insert or removal of media, a service, upgrade, and/or a maintenance procedure. Enclosure 3001 may comprise one or more side wall(s) or panels 3002. Enclosure 3001 may also include at least one top panel 3004 disposed over the top surface of data storage library 1002 (and any associated environmental conditioning unit(s), such as environmental conditioning unit 1012 shown within enclosure 1020 in FIGS. 1B and 5). Enclosure 3001 may substantially and/or entirely surround library frame(s) 1002 so as to form a barrier around library frame(s) 1002 to provide an environment separate from the environment of the surrounding room (e.g., the data center). In one embodiment, the enclosure 3001 resists, inhibits, and/or prevents environmental conditions outside the enclosure from intruding and/or infiltrating into the interior chamber formed by the enclosure 3001.

Enclosure 3001 may be formed of any rigid structural material, preferably a material such as, for example, wood, plastic, carbon fiber, metal, etc. Additionally and/or alternatively, enclosure 3001 may comprise multiple layers of multiple materials, either alike or different, so as to provide varying degrees of insulating properties, if needed. One or more layers of material of enclosure 3001 may be an insulation layer. Furthermore, at least a portion of enclosure 3001 may be formed of a substantially water-resistant or waterproof material. Enclosure 3001 may be constructed around library frame(s) 1002 so as to be either a portable, permanent, or semi-permanent structure. The material preferably provides a barrier to environmental conditions, for example, temperature, heat, and/or humidity. In one embodiment, the enclosure 3001 is capable of providing and/or maintaining relatively stable environmental conditions within enclosure 3001. In yet another embodiment, the enclosure may be substantially sealable.

At least one access door 3006 may be provided at an access opening 3009 on at least one of side wall panel(s) 3002 so as to allow selective access by an operator into the interior chamber 3010 formed by enclosure 3001. Access door 3006 may be a hinged door constructed of the same or similar materials as the side wall panel(s) 3002, such as, for example, wood, plastic carbon fiber, metal, etc. Alternatively, access door 3006 may be made of a different, non-rigid material, such as nylon, polyester, canvas, cotton, silk, plastic, foil, a para-aramid synthetic fiber (e.g., KEVLAR®), or any other suitable flexible material. Access door 3006 may comprise a hinged door (e.g., an office door, cabinet door, etc.), hinged flap (e.g., a non-zippered door to a camping tent), a zippered door (e.g., a zippered camping tent door), one or more vertically-hanging slats or flaps (e.g., a door to a high traffic cold storage room), a split membrane (e.g., a flexible slot or hole that remains closed until forced open), an air curtain (e.g., a high traffic store front that uses a wall of forced air to create an environmental barrier), a sliding panel (e.g., a sliding closet door, a pocket door, etc.), a rolled door (e.g., rolling blinds, rolled security door, etc.), or any entryway barrier that will provide some degree of environmental control when not being accessed. Access door 3006 preferably permits ingress and egress from the chamber 3010 and may be selectively openable and closable. When opened, access door 3006 provides an access opening 3009 preferably of sufficient size to permit a technician or operator (human adult) access to the interior chamber 3010 of the enclosure 3001. Door 3006 preferably provides a barrier between the environmental conditions in the enclosure 3001 and the environmental conditions outside the enclosure 3001.

When access door 3006 is closed, enclosure 3001 may form a chamber having environmental conditions around library frame(s) 1002, either encompassing all of the library frame(s) 1002, or at least those portions of library frame(s) 1002 where a technician may gain access to the interior of frame(s) 1002. The chamber 3010 formed by enclosure 3001 may be brought to the same or similar environmental condition(s) as the interior environmental conditions of library frame(s) 1002 in one embodiment via communication with the conditioned air provided to the interior of frame(s) 1002. For example, frame(s) 1002 may have one or more vents 1090 capable of transferring conditioned air from within frame(s) 1002 externally, thereby providing the conditioned air into the interior of enclosure 3001 and/or circulating return air from the interior of enclosure 3001. Alternatively, vent(s) 1090 may be coupled directly to the input (return air) and/or output (supply air) of the environmental conditioning unit without first going through the interior of frame(s) 1002. Vent(s) 1090 may be selectively opened and closed, either manually (e.g., by a technician moving a vent closure, closing access door 3006, etc.) or automatically (e.g., using actuators or motors under the control of a library controller or under the control of an environmental conditioning unit), to communicate conditioned air into enclosure 3001. Alternatively and/or additionally, one or more portals or doors may be provided in library frame(s) 1002 to allow conditioned air from within the library frame(s) 1002 to reach the enclosure 3001.

Furthermore, library frame(s) 1002 may naturally leak a certain amount of conditioned air during operation that would effectively condition the air within enclosure 3001, even without dedicated vent(s), portal(s), door(s), etc. In addition, an environmental conditioning unit may be configured to create a positive air pressure within library frames(s) 1002 and/or an environmental conditioning unit may be configured to pull external ambient air (return air) from outside library frames(s) 1002 or from inside enclosure 3001. Enclosure 3001 may also utilize one or more environmental condition sensors 3005 (e.g., temperature and/or humidity sensors) so as to monitor the environmental conditions within the enclosure 3001. Measurements, readings, and/or signals from the one or more environmental condition sensors 3005 may be provided to a library controller (such as controller 400 shown and described with respect to FIG. 4), and/or may be provided to an environmental conditioning unit (such as environmental conditioning unit 1012 shown and described with respect to FIG. 5), and/or may be provided to a display (not shown) such that the operator may visually determine the environmental conditions within the enclosure 3001. If readings are supplied to the controller, the controller may make a comparison between the sensors inside the library and inside the enclosure and provide a visual, audible, or other alert when access to the library may be made. Alternatively, enclosure 3001 may comprise no environmental condition sensors, and an operator or service technician may rely solely on the passage of time or operator judgement to determine when the desired environmental conditions (e.g., temperature and/or humidity) in the enclosure 3001 are the same, similar to, and/or within a desired range as the corresponding environmental condition(s) within library frame(s) 1002, or otherwise sufficiently safe to perform the desired procedure.

The enclosure 3001 in FIG. 7 is configured and adapted to substantially and/or entirely surround the data storage library, but preferably provides a chamber of sufficient size to permit the technician to enter the interior 3010 of the enclosure 3001 through the access door 3006 and close the access door 3006 while the technician or operator (human adult) is inside the enclosure 3001. The chamber is preferably of sufficient size that the technician can move and/or open the desired access panels and/or doors of the data storage library while within the enclosure 3001, and preferably has sufficient room to provide insert or removal of media, repair services, upgrades and/or maintenance on the library.

While not shown in FIG. 7, library frame(s) 1002 may comprise or have at least one associated and/or integrated environmental conditioning unit 1012, such as those shown in FIGS. 1B and 5. It may be desirable to provide active venting (venting that uses fans or forced air) or passive venting (no air movement devices) to the at least one environmental conditioning unit 1012, independent of the space inside enclosure 3001. For example, the at least one environmental conditioning unit 1012 may comprise an air conditioner. Air conditioners generally comprises a heat exchanger, which emits waste heat therefrom. If enclosure 3001 were to fully enclose environmental conditioning unit 1012, the waste heat emitted by environmental conditioning unit 1012 may cause the environmental conditions within enclosure 3001 to become warmer and/or more humid, regardless of any communication with the interior environmental conditions of the library frame(s) 1002. In another example, the at least one environmental conditioning unit 1012 may comprise a heat pump which may produce cold waste air. Air conditioners, thermoelectric coolers, heat pumps, thermoelectric heaters are a few examples of environmental conditioning units that may produce waste air and, thus, benefit from venting. Accordingly, system 3000 may further comprise one or more vents (not shown) similar to vents 2006 shown and described above with respect to FIG. 6. The one or more vents may be capable of venting waste air from the environmental conditioning unit(s) 1012 out of enclosure 3001. The one or more vents may include, consist of, or be formed by rigid or flexible ducts, or enclosure 3001 may provide direct exterior access to venting provided on the environmental conditioning unit(s) 1012 through one or more openings in the at least one top panel 3004 and/or the side panel 3002. In this way, waste air from the environmental conditioning unit(s) 1012 preferably is expelled to the exterior of the data storage library and the enclosure 3001, and preferably does not affect the environmental conditions within enclosure 3001.

As enclosure 3001 may be maintained at the same (or substantially the same) environmental conditions as the interior of library frame(s) 1002, an operator may access the interior of library frame(s) 1002 for insert or removal of media, maintenance, component replacement, upgrades, etc., without an influx of air from within the surrounding room (e.g., the data center) from entering the library frame(s) 1002. For example, the desired environmental conditions (e.g., temperature and/or humidity) within the enclosure 3001 may be acclimated to be at, near, or within the desired range of the corresponding environmental conditions (e.g., temperature and/or humidity), at which point the technician may open a moveable panel (e.g., an access door and/or panel) to the interior of the library. Since the enclosure serves as an environmental barrier to the environmental conditions outside the enclosure (and the data storage library), and since the conditions within the enclosure have acclimated to the desired environmental conditions, the interior of the data storage library should not be exposed to environmental conditions from outside the enclosure 3001 (e.g. data room environmental conditions). In this way, enclosure 3001 may inhibit, resist, and/or prevent undesirable environmental conditions (e.g., air contaminants, the formation and/or accumulation of condensation on sensitive componentry, etc.) within library frame(s) 1002. Furthermore, enclosure 3001 may be temporarily erected when operator access into a particular library frame or frames is needed, and may be dismantled when access is no longer needed. Alternatively, enclosure 3001 may be temporarily moved into place when operator access into a particular library frame or frames is needed, and/or may be moved away when access is no longer needed. For movement, enclosure 3001 may comprise wheels, rollers, skids, casters, sliders, etc. or may be lifted, hoisted, carried, pulled, pushed, slid, etc. As such, a single enclosure 3001 may be utilized for access and service of a group of separate libraries and/or library frame(s) 1002 at different times. Access door 3006 may comprise a means for determining if the door is closed. For example, the access opening 3009 or access door 3006 may comprise a door switch or sensor that is coupled to a controller (such as library controller 400 shown and described with respect to FIG. 4), an environmental conditioning unit, and/or an audio or visual indicator. The switch or sensor may be used to alert a technician (i.e., anyone that requires access to the interior of the library) that access door 3006 is open, it may be used to control the movement of conditioned air from library frame(s) 1002 into the chamber 3010, and/or it may be used to activate/deactivate an environmental conditioning unit. While flat sides and rectangular shapes are described and shown with respect to FIG. 7, enclosure 3001 may comprise other shapes and sides (e.g., circular, cylindrical, spherical, triangular, etc.).

Figure 8:
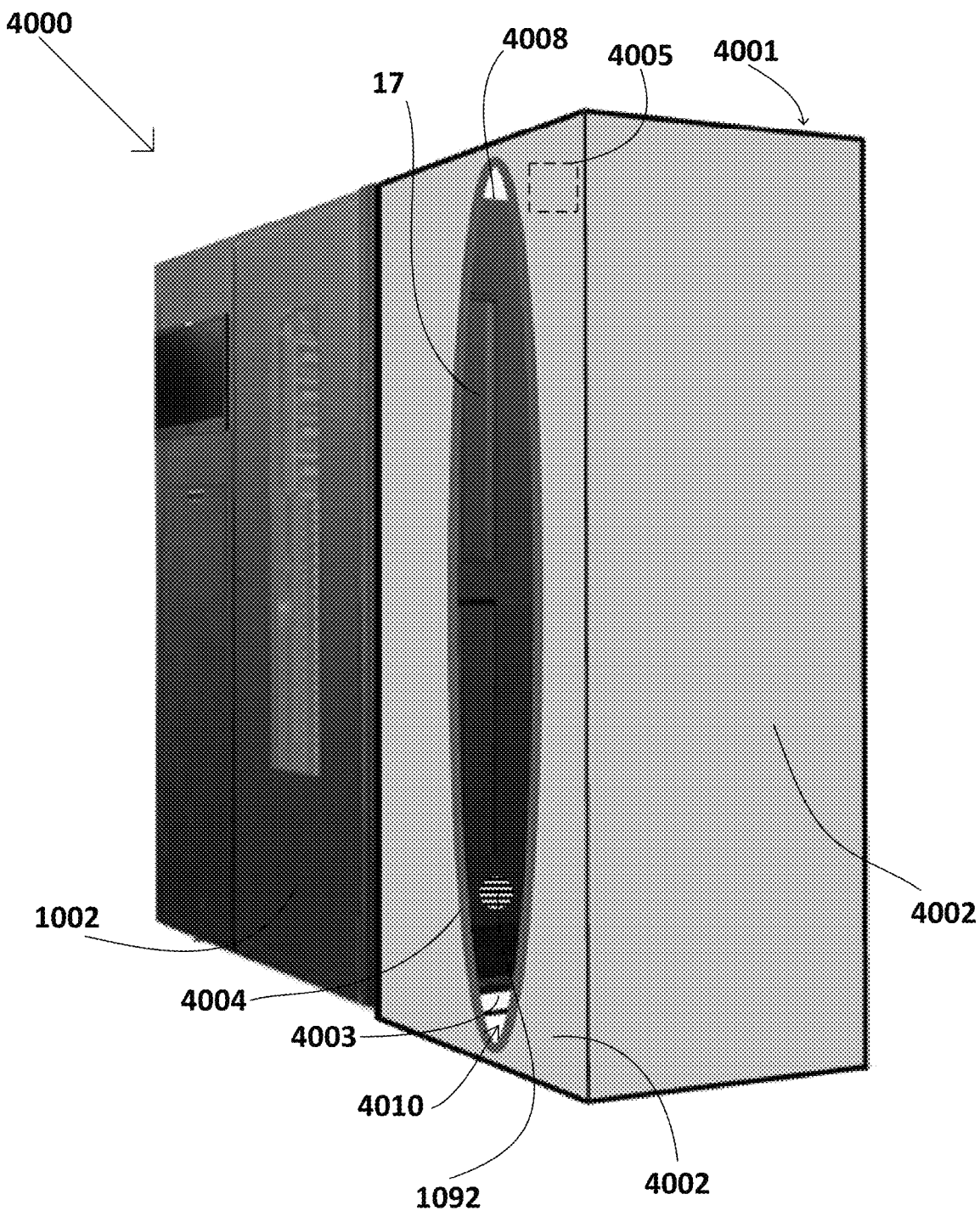
FIG. 8 is a perspective view of a data storage library and enclosure in accordance with another aspect.

Referring now to FIG. 8, another embodiment of a service access system is disclosed. Service access system 4000, like service access systems 2000 and 3000 described above, comprises an enclosure 4001 configured to be located adjacent a data storage library frame(s) 1002, such as that described above with respect to FIG. 5. In one aspect, enclosure 4001 is configured to be adjacent to at least one library frame and to surround at least one library access or service opening. While FIG. 8 only shows library frame 1002 comprising a single library frame, it is to be understood that library frame 1002 may comprise a plurality of frames, such as that which is illustrated in FIGS. 1A-1B. Library frame(s) 1002 may comprise conventional data storage library componentry, similar to that which is found in library 10 described above with respect to FIG. 2. For instance, one or more of library frames 1002 may comprise a plurality of storage slots to hold data storage cartridges associated with data storage media, one or more data storage drives to write and/or read data associated with data storage media associated with data storage cartridges, control and communication cards, one or more robotic accessors, etc. Furthermore, while not shown in FIG. 8, data storage library 1002 may be equipped with one or more environmental conditioning units, such as that which is described above with respect to data storage library 10 in FIG. 1B and data storage library 1004 in FIG. 5. The environmental conditioning unit(s) may control one or more environmental conditions (e.g., temperature and/or humidity) within the library frame(s) 1002. In one embodiment, it is contemplated that the data storage library will be a tape library which may include tape cartridges, tape drives, and accessors.

Enclosure 4001 of service access system 4000 comprises one or more side panels 4002. Enclosure 4001 may also include a top panel (not shown). Additionally, a skirt 4003 may be included, with skirt 4003 capable of providing a barrier and/or seal between the bottom portion of library frame(s) 1002 and the floor or other surface upon which library frame(s) 1002 stand. Furthermore, unlike service access systems 2000, 3000 described above, enclosure 4001 is configured to enclose one side of library frame(s) 1002 and/or one library access opening. For example, enclosure 4001 may only enclose a side (or partial side) adjacent a front panel 17 (i.e., movable panel) which covers an opening to the library that provides access to the interior of library frame(s) 1002. Enclosure 4001 may also be configured to enclose only one side of the data storage library. Alternatively, enclosure 4001 may be configured to enclose one or more sides and/or access panels to the data storage library, but in one embodiment, preferably not all sides and/or the top of the data storage library. In this way, enclosure 4001 may provide an environmentally-controlled access area to library frame(s) 1002, but without the need for venting or additional enclosure materials present in full-frame enclosures. In one embodiment, the enclosure 4001 has a working opening 4008 which aligns with and corresponding with the at least one access opening of the data storage library. The working opening preferably communicates with the access opening of the library when a movable panel (e.g., panel and/or door) of the library is opened and/or removed to permit the technician access to the interior of the data storage library.

Enclosure 4001 preferably forms a chamber 4010. In one aspect, the chamber 4010 may be of sufficient size to contain an adult human. The chamber 4010 may be of sufficient size to permit the adult human to remain within and be surrounded by the enclosure 4001 while performing service on the library. The chamber 4010 of the enclosure 4001 may also be sized to permit the library panel or door to be moved (e.g., opened, closed, and/or removed) inside the enclosure to provide access into the interior of the library.

Enclosure 4001 further includes an access opening 4004 on at least one side thereof. Access opening 4004 is shown in FIG. 8 to be a zippered door, but may be any appropriate opening. Opening 4004 is preferably substantially sealable. In one embodiment, opening 4004 preferably comprises a barrier, e.g., a door, that resists intrusion of environmental conditions. The access opening 4004 preferably is of sufficient size to permit access by a technician or operator (human adult) to the interior chamber 4010 of the enclosure 4001. While the access opening 4004 is illustrated in FIG. 8 as being selectively openable and closeable using a zipper, it should be appreciated that access opening 4004 may be provided with a hinged door (e.g., an office door, cabinet door, etc.), hinged flap (e.g., a non-zippered door to a camping tent), a zippered door (e.g., a zippered camping tent door), one or more vertically-hanging slats or flaps (e.g., a door to a high traffic cold storage room), a split membrane (e.g., a flexible slot or hole that remains closed until forced open), an air curtain (e.g., a high traffic store front that uses a wall of forced air to create an environmental barrier), a sliding panel (e.g., a sliding closet door, a pocket door, etc.), a rolled door (e.g., rolling blinds, rolled security door, etc.), or any other suitable closure mechanism or barrier that resists environmental conditions outside the enclosure from intruding into the enclosure. Enclosure 4001 may be formed of a flexible material, such as nylon, polyester, canvas, cotton, silk, plastic, foil, a para-aramid synthetic fiber (e.g., KEVLAR®), or any other flexible material capable of providing a suitable enclosure for maintaining stable environmental conditions within the enclosure 4001. In one embodiment, the enclosure 4001 resists, inhibits, and/or prevents environmental conditions outside the enclosure from intruding and/or infiltrating into the interior chamber formed by the enclosure. Enclosure 4001 may be easily set up and installed (and/or uninstalled) to surround at least one access panel. For example, one or more side panels 4002 and the top panel may be self-supporting, or may be held by a collapsible and/or removable framework structure (not shown). The framework structure may be formed of any appropriate material, such as, for example, a plurality of fiberglass, aluminum, carbon fiber, or para-aramid synthetic fiber (e.g., KEVLAR®) poles, brackets, extensions, etc. The framework structure may be broken down so as to enable the enclosure 4001 to be portable and storable when not in use. Additionally, the framework structure may comprise a plurality of spring-biased joints, enabling the structure to automatically erect when opened. While shown partially surrounding the front panel 17 of library frame(s) 1002 in FIG. 8, it is to be understood that enclosure 4001 may or may not be erected alone and may not require the presence of one or more library frames 1002 in order to maintain shape and form. Alternatively, enclosure 4001 may be formed of a rigid structural enclosure, similar to enclosure 3001 described above, or it may be formed of a combination of rigid and flexible materials. If a rigid structural enclosure is used, access opening 4004 may be formed as a hinged door, similar to door 3006 described above with respect to FIG. 7.

When access opening 4004 is closed and/or sealed, enclosure 4001 may form a chamber having environmental conditions around and/or adjacent to the front panel 17 of library frame(s) 1002 that may be substantially separate from and different than the environmental conditions outside enclosure 4001. In one embodiment the enclosure may be substantially sealable. The chamber of the enclosure 4001 may be brought to the same or similar environmental condition(s) as the interior environmental conditions of library frame(s) 1002 via environmental communication with the conditioned air provided to the interior of frame(s) 1002. For example, front panel 17 of frame(s) 1002 may have one or more vents 1092 capable of transferring conditioned air from within frame(s) 1002 externally of the data storage library and into the interior of enclosure 4001. Alternatively, vent(s) 1092 may be coupled directly to the input (return air) and/or output (supply air) of the environmental conditioning unit without first going through the interior of frame(s) 1002. If adjustable, vent(s) 1092 may be selectively opened and closed, either manually (e.g., by a technician moving a vent closure, closing an access door associated with access opening 4004, etc.) or automatically (e.g., using actuators or motors under the control of a library controller or under the control of an environmental conditioning unit), to communicate conditioned air into enclosure 4001. Alternatively and/or additionally, library frame(s) 1002 may naturally leak a certain amount of conditioned air during operation that would effectively condition the air within enclosure 4001, even without dedicated vent(s), portal(s), door(s), opening(s), etc. In addition, an environmental conditioning unit may be configured to create a positive air pressure within library frames(s) 1002 and/or an environmental conditioning unit may be configured to pull external ambient air (return air) from outside library frames(s) 1002 or from inside enclosure 4001. Enclosure 4001 may also utilize one or more environmental condition sensors 4005 (e.g., temperature and/or humidity sensors) so as to monitor the environmental conditions within the enclosure 4001.

The enclosure in one embodiment is configured and constructed to resist environmental conditions from the exterior of the library from intruding into the chamber of enclosure 4001, while permitting environmental conditions from the interior of the library to intrude into the chamber of the enclosure 4001. Herein, environmental conditions and environmentally conditioned air from the interior of the library may refer to air that has been conditioned either after it has been directed to the interior of the library, before being directed into the library, and/or without being directed into the library. Working opening 4008 may facilitate the environmental conditions within the interior of the data storage library from entering, intruding, mixing with, and/or infiltrating the chamber 4010 of the enclosure 4001. In one aspect, working opening 4008 is generally a hole or aperture in at least one side wall of the enclosure 4001 that is sized and constructed to permit access by a technician into the interior of the data storage library, and may not have an associated barrier to close working opening 4008. Alternatively, working opening 4008 may have an associated barrier, such as, for example, a hinged door (e.g., an office door, cabinet door, etc.), hinged flap (e.g., a non-zippered door to a camping tent), a zippered door (e.g., a zippered camping tent door), one or more vertically-hanging slats or flaps (e.g., a door to a high traffic cold storage room), a split membrane (e.g., a flexible slot or hole that remains closed until forced open), an air curtain (e.g., a high traffic store front that uses a wall of forced air to create an environmental barrier), a sliding panel (e.g., a sliding closet door, a pocket door, etc.), a rolled door (e.g., rolling blinds, rolled security door, etc.), to close the working opening 4008. Measurements, readings, and/or signals from the one or more environmental condition sensors 4005 may be provided to a library controller (such as controller 400 shown and described with respect to FIG. 4), and/or may be provided to an environmental conditioning unit (such as environmental conditioning unit 1012 shown and described with respect to FIG. 5), and/or may be provided to a display (not shown) such that the operator may determine the environmental conditions within the enclosure 4001. If readings are taken and supplied to the controller, in one aspect the controller may make a comparison between the sensors inside the library, outside the library, and/or inside the enclosure and provide a visual, audible, and/or other alert or notification when access to the library may be made. Alternatively, enclosure 4001 may comprise no environmental condition sensors, and an operator or technician may rely solely on the passage of time or operator judgement in order to determine when the desired environmental conditions are the same, similar, and/or within a desired range as the corresponding environmental condition(s) within the library frame(s) 1002, or otherwise sufficiently safe to access the interior of the library. In one example, enclosure 4001 may or may not be erected and the technician may wait a set period of time, e.g., twenty-four (24) hours before accessing the interior of the enclosure 4001.

Due to enclosure 4001 not encompassing the entire library frame(s) 1002, and preferably not enclosing the environmental conditioning unit, waste air emitted by an environmental conditioning unit associated with library frame(s) 1002 will not affect the interior environmental conditions of enclosure 4001, and thus may not require venting from enclosure 4001. Furthermore, while not shown in FIG. 8, it is to be understood that one enclosure 4001 or multiple enclosures 4001 may be disposed about multiple access points on the library frame(s) 1002, thereby enabling environmentally-controlled access at multiple locations.

As enclosure 4001 may be maintained at the same (or substantially the same) environmental conditions as the interior of library frame(s) 1002, an operator may access the interior of library frame(s) 1002 for insert or removal of media, maintenance, service, component replacement, upgrades, etc., without an influx of air from within the surrounding room (e.g., the data center) from entering the library frame(s) 1002. For example, the desired environmental conditions (e.g., temperature and/or humidity) within the enclosure may be acclimated to be at, near, and/or within a desired range of the corresponding environmental conditions (e.g., temperature and/or humidity) at which point the technician may access the interior of the enclosure. Since the enclosure serves as an environmental barrier to the environmental conditions outside the enclosure (e.g., data room environmental conditions) and since the conditions within the enclosure have acclimated to the desired environmental conditions of the interior of library frame(s) 1002 (which are most likely different than the environmental conditions outside the enclosure), the interior of the library should not be exposed to environmental conditions from outside the enclosure (e.g., data room environmental conditions). In this way, enclosure 4001 may resist, inhibit, and/or prevent undesirable environmental conditions (e.g., air contaminants, the formation and/or accumulation of condensation on sensitive componentry, etc.) within library frame(s) 1002. Furthermore, enclosure 4001 may be temporarily erected when operator access into a particular library frame or frames is needed, and may be dismantled when access is no longer needed. Alternatively, enclosure 4001 may be temporarily moved into place when operator access into a particular library frame or frames is needed, and/or may be moved away when access is no longer needed. For movement, enclosure 4001 may comprise wheels, rollers, skids, casters, sliders, etc. or may be lifted, hoisted, carried, pulled, pushed, slid, etc. As such, a single enclosure 4001 may be utilized for access and service of a group of separate libraries and/or library frame(s) 1002 at different times. Access opening 4004 or its associated access door may comprise a means for determining if the opening is closed. For example, the access opening or access door may comprise a switch or sensor that is coupled to a controller (such as library controller 400 shown and described with respect to FIG. 4, a dedicated enclosure controller, etc.), an environmental conditioning unit, and/or an audio or visual indicator. The switch or sensor may be used to alert a technician (anyone that requires access to the interior of the library) that access opening 4004 is open, it may be used to control the movement of conditioned air from library frame(s) 1002 into the chamber 4010, and/or it may be used to activate/deactivate an environmental conditioning unit. While flat sides and rectangular shapes are described and shown with respect to FIG. 8, enclosure 4001 may comprise other shapes and sides (e.g., circular, cylindrical, spherical, triangular, etc.).

Figure 9:
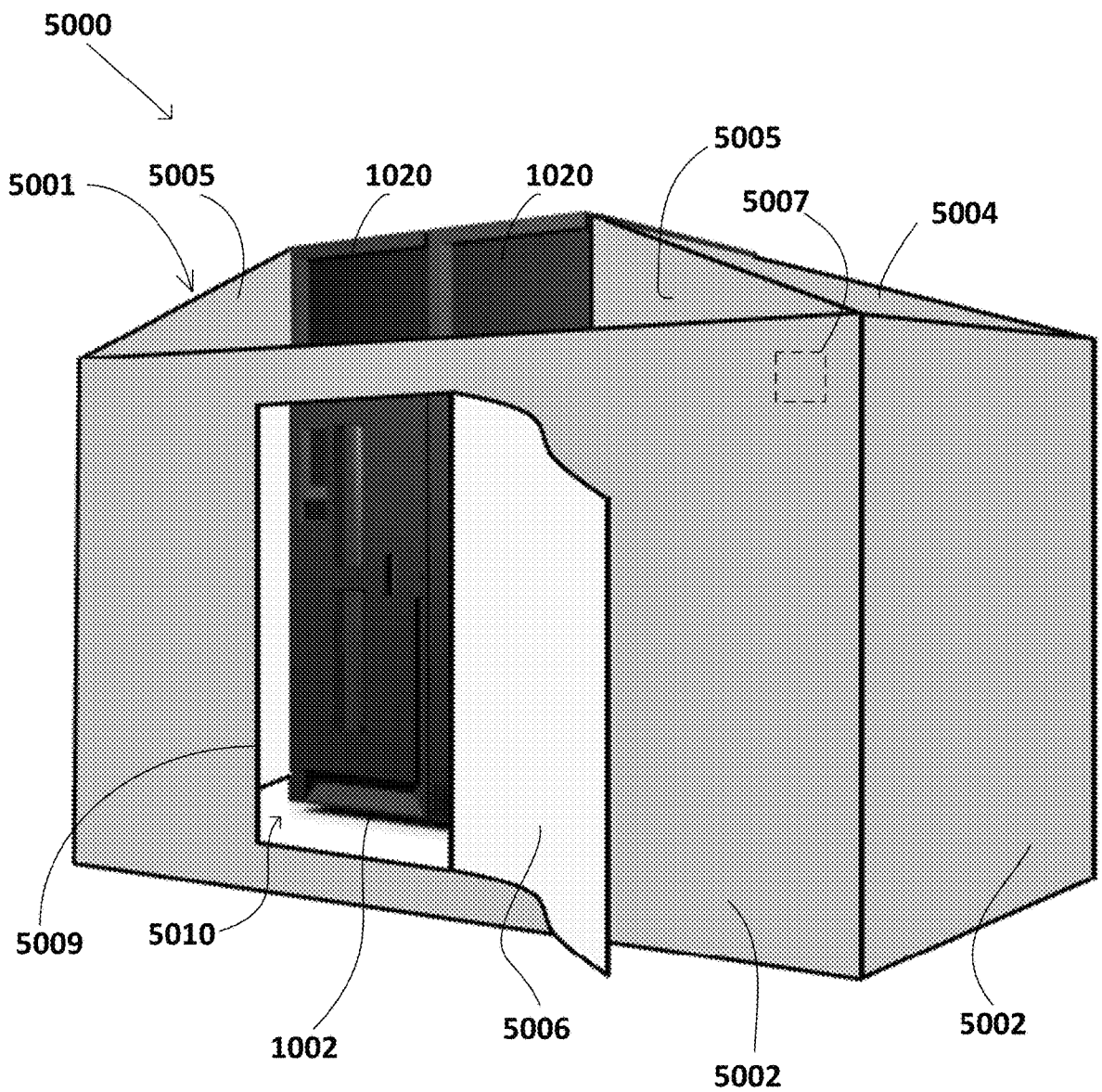
FIG. 9 is a perspective view of a data storage library and enclosure in accordance with another aspect.

Next, referring to FIG. 9, a service access system 5000 in accordance with another aspect of the disclosure is illustrated. Service access system 5000 comprises an enclosure 5001 substantially surrounding the data storage library frame(s) 1002. Enclosure 5001 may comprise one or more side wall(s) or panels 5002. Enclosure 5001 further may include one or more top panels 5004 disposed over the top surface of data storage library frame(s) 1002. Additional top side panels 5005 enclose top portions of enclosure 5001, but extend only to respective environmental conditioning unit enclosures 1020 disposed on top of library frame(s) 1002. In this way, waste air generated by the environmental conditioning units (not shown) within environmental conditioning unit enclosures 1020 is not captured within enclosure 5001, but is instead vented to the outside environment (e.g., into the data center or out of the data center building). Enclosure 5001 may have a tent-like structure, with the capability of being easily and quickly installed (and/or uninstalled) to substantially surround a data storage library frame(s) 1002. The side wall panels 5002, top panel(s) 5004, and top side panels 5005 may be self-supporting, or may be held by a collapsible and/or removable framework structure (not shown).

Enclosure 5001 may be formed of any suitable material, such as nylon, polyester, canvas, cotton, silk, plastic, foil, a para-aramid synthetic fiber (e.g., KEVLAR®), or any other flexible material. The material preferably provides a barrier to environmental conditions. In one embodiment, the material of the enclosure resists, inhibits, and/or prevents environmental conditions outside the enclosure from intruding and/or infiltrating into the chamber of the enclosure. In another embodiment, the enclosure is capable of providing and/or maintaining stable environmental conditions within the enclosure 5001. In yet another embodiment, the enclosure may be substantially sealable. Additionally and/or alternatively, enclosure 5001 may comprise multiple layers of multiple materials, either alike or different, so as to provide varying degrees of insulating properties, if needed. One or more layers of material of enclosure 5001 may be an insulation layer. Furthermore, at least a portion of enclosure 5001 may be formed of a substantially water-resistant or waterproof material.

At least one access door 5006 may be provided on at least one of side wall panel(s) 5002 so as to allow selective access by an operator into the interior of the chamber 5010 formed by enclosure 5001. Access door 5006 may be made of any suitable material or combination of materials, be they the same or different materials than enclosure 5001, such as, for example, nylon, polyester, canvas, cotton, silk, plastic, foil, a para-aramid synthetic fiber (e.g., KEVLAR®), or any other flexible material. In one embodiment, the access door may be selectively openable and closable. When open, access door 5006 provides an access opening 5009, preferably of sufficient size and shape to permit a technician (human adult) access to the interior of chamber 5010 of enclosure 5001. Furthermore, access door 5006 may be configured as a hinged door (e.g., an office door, cabinet door, etc.), hinged flap (e.g., a non-zippered door to a camping tent), a zippered door (e.g., a zippered camping tent door), one or more vertically-hanging slats or flaps (e.g., a door to a high traffic cold storage room), a split membrane (e.g., a flexible slot or hole that remains closed until forced open), an air curtain (e.g., a high traffic store front that uses a wall of forced air to create an environmental barrier), a sliding panel (e.g., a sliding closet door, a pocket door, etc.), a rolled door (e.g., rolling blinds, rolled security door, etc.), or any other appropriate closure capable of allowing selective access, yet providing a barrier between environmental conditions inside and outside enclosure 5001. In one embodiment, door 5006 may maintain a sealed environment within enclosure 5001.

When access door 5006 is closed, enclosure 5001 may form a barrier to the environmental conditions outside the enclosure. Enclosure 5001 in one embodiment may provide a barrier around the library. The environmental conditions within chamber 5010 may be acclimated to be different than the environmental conditions outside the enclosure. And in yet another aspect, the enclosure may form a substantially sealed environment around library frame(s) 1002, either encompassing all of the library frame(s) 1002, or at least those portions of library frame(s) 1002 where an operator may gain access to the interior of frame(s) 1002. The chamber 5010 of enclosure 5001 may be brought to the same or similar environmental condition(s) as the interior environmental conditions of library frame(s) 1002 in one embodiment via communication with the conditioned air provided to the interior of frame(s) 1002. For example, one or more vents, portals, or doors (similar to vent(s) 1090 described above with respect to FIG. 6) may be provided in one or more locations on library frame(s) 1002 so as to communicate conditioned air from within the interior of frame(s) 1002 into the enclosure 5001. Alternatively, the one or more vents may be coupled directly to the input (return air) and/or output (supply air) of the environmental conditioning unit without first going through the interior of frame(s) 1002. Enclosure 5001 may also utilize one or more environmental condition sensors 5007 (e.g., temperature and/or humidity sensors) so as to monitor the environmental conditions within the enclosure 5001.

Measurements, readings, and/or signals from the one or more environmental condition sensors 5007 may be provided to a library controller (such as controller 400 shown and described with respect to FIG. 4), and/or may be provided to an environmental conditioning unit (not shown), and/or may be provided to a display (not shown) such that the operator may determine the environmental conditions within the enclosure 5001. If readings from the sensors are provided to the controller, the controller may make a comparison between the sensors inside the data storage library, outside the enclosure, and/or inside the enclosure, more likely comparing sensor readings between the inside of the library and inside the enclosure, and provide a visual, audible, and/or other alert and/or notification when access to the library may be made. Alternatively, enclosure 5001 may comprise no environmental condition sensors, and an operator or technician may rely solely on the passage of time or operator judgement as to when the desired environmental conditions are the same, similar, and/or within a desired range as the corresponding environmental condition(s) within the library frame(s) 1002.

The enclosure 5001 in FIG. 9 is configured and adapted to substantially and/or entirely surround the data storage library, but preferably provides a chamber of sufficient size to permit a technician to enter the interior 5010 of the enclosure 5001 through the access door 5006 and close the access door 5006 while the technician (human adult) is inside the enclosure 5001. The chamber is preferably of sufficient size that the technician can move and/or open the desired access panels and/or doors of the data storage library while within the enclosure 5001, and preferably has sufficient room to insert or remove media, provide repair services, upgrades and/or maintenance on the library.

As enclosure 5001 may be maintained at the same (or substantially the same) environmental conditions as the interior of library frame(s) 1002, an operator may access the interior of library frame(s) 1002 for insert or removal of media, maintenance, component replacement, upgrades, etc., without an influx of air from within the surrounding room (e.g., the data center) from entering the library frame(s) 1002. For example, the desired environmental conditions (e.g., temperature and/or humidity) within the enclosure 5001 may be acclimated to be at, near, or within the desired range of the corresponding environmental conditions (e.g., temperature and/or humidity), at which point the technician may open an access door and/or panel to the interior of the library. Since the enclosure serves as an environmental barrier to the environmental conditions outside the enclosure (and the data storage library), and since the conditions within the enclosure have acclimated to the desired environmental conditions, the interior of the data storage library should not be exposed or will be only minimally exposed to environmental conditions from outside the enclosure 5001 (e.g. data room environmental conditions). In this way, enclosure 5001 may resist, inhibit, and/or prevent undesirable environmental conditions (e.g., air contaminants, the formation and/or accumulation of condensation on sensitive componentry, etc.) within library frame(s) 1002. Furthermore, enclosure 5001 may be temporarily erected when operator access into a particular library frame or frames is needed, and may be dismantled when access is no longer needed. Alternatively, enclosure 5001 may be temporarily moved into place when operator access into a particular library frame or frames is needed, and/or may be moved away when access is no longer needed. For movement, enclosure 5001 may comprise wheels, rollers, skids, casters, sliders, etc. or may be lifted, hoisted, carried, pulled, pushed, slid, etc. As such, a single enclosure 5001 may be utilized for access and service of a group of separate libraries and/or library frame(s) 1002 at different times. Access opening 5009 or access door 5006 may comprise a means for determining if the opening is closed. For example, the access door or access opening may comprise a door switch or sensor that is coupled to a controller (such as library controller 400 shown and described with respect to FIG. 4, a dedicated enclosure controller, etc.), an environmental conditioning unit, and/or an audio or visual indicator. The switch or sensor may be used to alert a technician (anyone that requires access to the interior of the library) that access door 5006 is open, it may be used to control the movement of conditioned air from library frame(s) 1002 into the chamber 5010, and/or it may be used to activate/deactivate an environmental conditioning unit. While flat sides and rectangular shapes are described and shown with respect to FIG. 9, enclosure 5001 may comprise other shapes and sides (e.g., circular, cylindrical, spherical, triangular, etc.).

Figure 10:
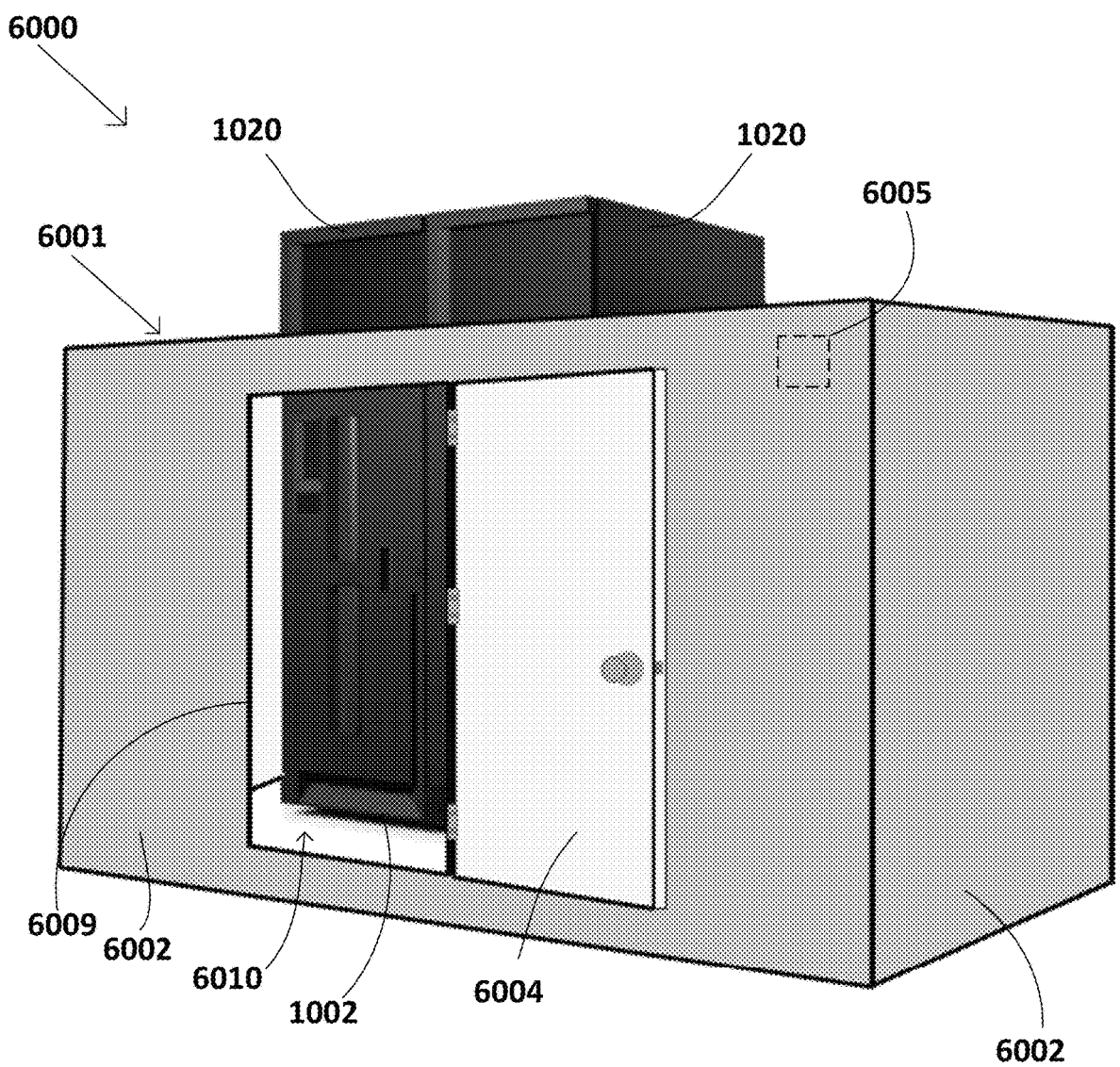
FIG. 10 is a perspective view of a data storage library and enclosure in accordance with another aspect.

Referring now to FIG. 10, a service access system 6000 in accordance with another aspect of the disclosure is illustrated. Service access system 6000 comprises an enclosure 6001 adapted and configured to substantially and/or entirely surround the data storage library frame(s) 1002. Enclosure 6001 may comprise one or more side wall(s) or panels 6002. Enclosure 6001 may include at least one top panel (not shown) associated with and/or disposed over the top surface of data storage library frame(s) 1002. Respective environmental conditioning unit enclosures 1020 disposed on top of library frame(s) 1002 are not enclosed by enclosure 6001. In this way, waste air generated by the environmental conditioning units (not shown) within environmental conditioning unit enclosures 1020 is not captured within enclosure 6001, but is instead vented to the outside environment (e.g., into the data center). Accordingly, enclosure 6001 may substantially surround library frame(s) 1002 so as to form a barrier around library frame(s) 1002, and in one aspect an environment relatively separate from the environment of the surrounding room (e.g., the data center). In one embodiment, the enclosure resists, inhibits, and/or prevents environmental conditions outside the enclosure from intruding and/or infiltrating into the interior chamber formed by the enclosure.

Enclosure 6001 may be formed of any rigid structural material such as, for example, wood, plastic, carbon fiber, metal, etc. Additionally, and/or alternatively, enclosure 6001 may comprise multiple layers of multiple materials, either alike or different, so as to provide varying degrees of insulating properties, if needed. Furthermore, at least a portion of enclosure 6001 may be formed of a substantially water-resistant or waterproof material. Enclosure 6001 may be constructed around library frame(s) 1002 so as to be either a portable, permanent, or semi-permanent structure. The material preferably provides a barrier to environmental conditions, for example, temperature, heat, and/or humidity. In one embodiment, the enclosure 6001 is capable of providing and/or maintaining relatively stable environmental conditions within enclosure 6001. In yet another embodiment, the enclosure 6001 may be substantially sealable.

At least one access door 6004 may be provided on at least one of side wall panel(s) 6002 so as to allow selective access by an operator into the interior chamber 6010 formed by enclosure 6001. Access door 6004 may be a hinged door constructed of the same or similar materials as the side wall panel(s) 6002, such as, for example, wood, plastic carbon fiber, metal, etc. Alternatively, access door 6004 may be made of a different, non-rigid material, such as nylon, polyester, canvas, cotton, silk, plastic, foil, a para-aramid synthetic fiber (e.g., KEVLAR®), or any other suitable flexible material. Door 6004 may comprise a hinged door (e.g., an office door, cabinet door, etc.), hinged flap (e.g., a non-zippered door to a camping tent), a zippered door (e.g., a zippered camping tent door), one or more vertically-hanging slats or flaps (e.g., a door to a high traffic cold storage room), a split membrane (e.g., a flexible slot or hole that remains closed until forced open), an air curtain (e.g., a high traffic store front that uses a wall of forced air to create an environmental barrier), a sliding panel (e.g., a sliding closet door, a pocket door, etc.), a rolled door (e.g., rolling blinds, rolled security door, etc.), or any entryway barrier that will provide some degree of environmental control when not being accessed. Door 6004 preferably permits ingress and egress from the chamber 6010 and may be selectively openable and closable. When opened, access door 6004 provides an access opening 6009 preferably of sufficient size to permit a technician (human adult) access to the interior chamber 6010 of enclosure 6001. Access door 6004 preferably provides a barrier between the environmental conditions in the enclosure and the environmental conditions outside the enclo sure.

When access door 6004 is closed, enclosure 6001 may form a chamber having environmental conditions around library frame(s) 1002, either encompassing all of the library frame(s) 1002, or at least those portions of library frame(s) 1002 where a technician may gain access to the interior of frame(s) 1002. The chamber 6010 formed by enclosure 6001 may be brought to the same or similar environmental condition(s) as the interior environmental conditions of library frame(s) 1002 via, in one embodiment, communication with the conditioned air provided to the interior of frame(s) 1002. For example, library frame(s) 1002 may have one or more vents or portals capable of transferring conditioned air from within library frame(s) 1002 externally, thereby providing the conditioned air into the interior of enclosure 6001 and/or circulating return air from the interior of enclosure 6001. Alternatively, the one or more vent may be coupled directly to the input (return air) and/or output (supply air) of the environmental conditioning unit without first going through the interior of frame(s) 1002. If adjustable, the vents or portals may be selectively opened and closed, either manually (e.g., by a technician moving a vent closure, closing access door 6004, etc.) or automatically (e.g., using actuators or motors under the control of a library controller or under the control of an environmental conditioning unit), to communicate conditioned air into enclosure 6001.

Furthermore, library frame(s) 1002 may naturally leak a certain amount of conditioned air during operation that would effectively condition the air within enclosure 6001, even without dedicated vent(s), portal(s), door(s), etc. In addition, an environmental conditioning unit may be configured to create a positive air pressure within library frames(s) 1002 and/or an environmental conditioning unit may be configured to pull external ambient air (return air) from outside library frames(s) 1002 or from inside enclosure 6001. Enclosure 6001 may also utilize one or more environmental condition sensors 6005 (e.g., temperature and/or humidity sensors) so as to monitor the environmental conditions within the enclosure 6001. Measurements, readings, and/or signals from the one or more environmental condition sensors 6005 may be provided to a library controller (such as controller 400 shown and described with respect to FIG. 4), and/or may be provided to an environmental conditioning unit (not shown), and/or may be provided to a display (not shown) such that the operator may determine the environmental conditions within the enclosure 6001. If readings are supplied to the controller, the controller may make a comparison between the sensors inside the library and inside the enclosure and provide a visual, audible, or other alert when access to the library may be made. Alternatively, enclosure 6001 may comprise no environmental condition sensors, and the operator or technician may rely solely on the passage of time or operator judgement as to when the desired environmental conditions (e.g., temperature and/or humidity) in the enclosure are the same, similar to, sufficiently safe, and/or within a desired range as the corresponding environmental condition(s) within the library frame(s) 1002. In one embodiment, the technician may wait twenty-four (24) hours but other lengths of time, e.g., 1, 10, 32, 36, etc., hours, are contemplated.

As enclosure 6001 may be maintained at the same (or substantially the same) environmental conditions as the interior of library frame(s) 1002, an operator may access the interior of library frame(s) 1002 for insert or removal of media, maintenance, service, upgrades, component replacement, etc., without an influx of air from within the surrounding room (e.g., the data center) from entering the library frame(s) 1002. For example, the desired environmental conditions (e.g., temperature and/or humidity) within the enclosure may be acclimated to be at, near, or within the desired range of the corresponding environmental conditions (e.g., temperature and/or humidity), at which point the technician may open an access door and/or panel to the interior of the library. Since the enclosure serves as an environmental barrier to the environmental conditions outside the enclosure (and the data library) and since the conditions within the enclosure have acclimated to the desired environmental conditions, the interior of the library should not be exposed or will be only minimally exposed to environmental conditions from outside the enclosure (e.g., data room environmental conditions). In this way, enclosure 6001 may resist, inhibit, and/or prevent undesirable environmental conditions (e.g., air contaminants, the formation and/or accumulation of condensation on sensitive componentry, etc.) within library frame(s) 1002. Furthermore, enclosure 6001 may be temporarily erected when operator access into a particular library frame or frames is needed, and may be dismantled when access is no longer needed. Alternatively, enclosure 6001 may be temporarily moved into place when operator access into a particular library frame or frames is needed, and/or may be moved away when access is no longer needed. For movement, enclosure 6001 may comprise wheels, rollers, skids, casters, sliders, etc. or may be lifted, hoisted, carried, pulled, pushed, slid, etc. As such, a single enclosure 6001 may be utilized for access and service of a group of separate libraries and/or library frame(s) 1002 at different times. Access door 6004 or access opening 6009 may comprise a means for determining if the opening is opened or closed. For example, the access door or access opening may comprise a door switch or sensor that is coupled to a controller (such as library controller 400 shown and described with respect to FIG. 4), an environmental conditioning unit, and/or an audio or visual indicator. The switch or sensor may be used to alert a technician (anyone that requires access to the interior of the library) that access door 6004 is open, it may be used to control the movement of conditioned air from library frame(s) 1002 into the chamber 6010, and/or it may be used to activate/deactivate an environmental conditioning unit. While flat sides and rectangular shapes are described and shown with respect to FIG. 10, enclosure 6001 may comprise other shapes and sides (e.g., circular, cylindrical, spherical, triangular, etc.).

Figure 11:
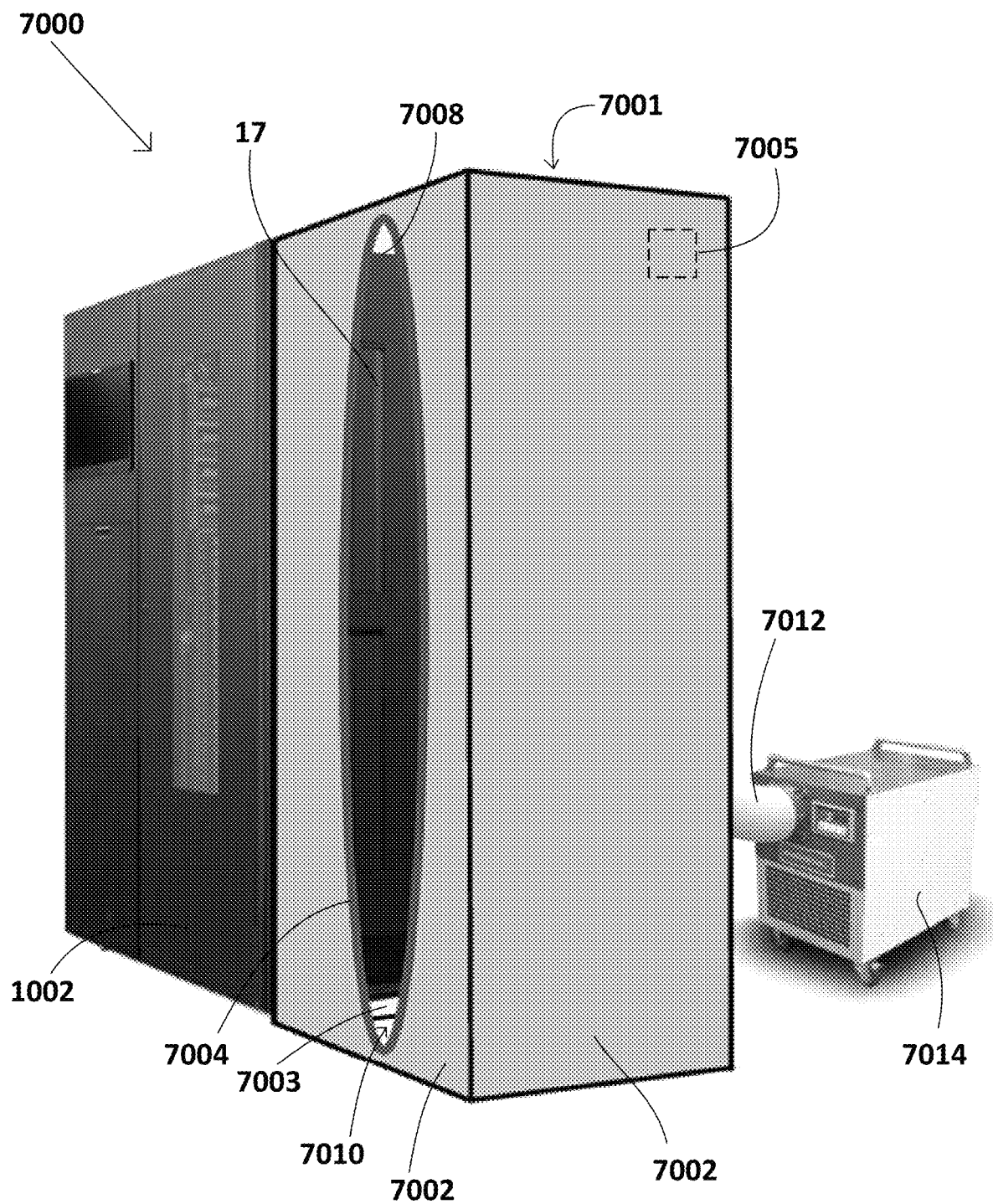
FIG. 11 is a perspective view of a data storage library and enclosure in accordance with another aspect.

Next, referring to FIG. 11, a service access system 7000 in accordance with another aspect is disclosed. Service access system comprises an enclosure 7001 having one or more side(s) or panels 7002. Enclosure 7001 preferably also includes a top panel (not shown). Additionally, a skirt 7003 may be included, with skirt 7003 capable of providing a barrier and/or seal between the bottom portion of library frame(s) 1002 and the floor or other surface upon which library frame(s) 1002 stands. Furthermore, enclosure 7001 may be configured to only enclose one side of library frame(s) 1002 and/or one library access opening. For example, enclosure 7001 may only enclose a side adjacent a front panel 17 which covers an opening to the library that provides access to the interior of library frame(s) 1002.

Enclosure 7001 may also be configured to enclose one side of the data storage library. Alternatively, enclosure 7001 may be configured to enclose one or more sides and/or access panels of the data storage library, but in one embodiment, preferably not all sides and/or not the top of the data storage library. In this way, enclosure 7001 may provide an environmentally-controlled access area to library frame(s) 1002, but without the need for venting the interior of library frame(s) 1002, venting from the environmental conditioning unit and/or additional panels present in full-frame enclosures.

In one embodiment, enclosure 7001 has a working opening 7008 which aligns with and corresponds with the at least one access opening of the library that is surrounded by the enclosure. The working opening 7008 preferably communicates with an access opening of the library when the panel and/or door of the library is opened and/or removed to permit the technician access to the interior of the data storage library. Enclosure 7001 may have one or more working openings which may correspond to one or more access openings in the data storage library frame(s) 1002. The working openings may be sized, shaped, and configured to be larger than, smaller than, or the same size as the library access openings. One or more optional barriers (e.g., doors) may be associated with the one or more working openings.

Enclosure 7001 further includes an access opening 7004 on at least one side thereof. Access opening 7004 is shown in FIG. 11 to be a zippered door, but may be any appropriate opening. Opening 7004 is preferably substantially sealable. In one embodiment, opening 7004 preferably comprises a barrier, e.g., a door, that resists intrusion of environmental conditions. The access opening 7004 preferably is of sufficient size to permit access by a technician (human adult) to the interior chamber 7010 of the enclosure 7001. While the access opening 7004 is illustrated in FIG. 11 as being selectively openable and closeable using a zipper, it should be appreciated that access opening 7004 may be provided with a hinged door (e.g., an office door, cabinet door, etc.), hinged flap (e.g., a non-zippered door to a camping tent), a zippered door (e.g., a zippered camping tent door), one or more vertically-hanging slats or flaps (e.g., a door to a high traffic cold storage room), a split membrane (e.g., a flexible slot or hole that remains closed until forced open), an air curtain (e.g., a high traffic store front that uses a wall of forced air to create an environmental barrier), a sliding panel (e.g., a sliding closet door, a pocket door, etc.), a rolled door (e.g., rolling blinds, rolled security door, etc.), or any other suitable closure mechanism or barrier that resists environmental conditions outside the enclosure from intruding into the enclosure.

Enclosure 7001 may be formed of a flexible material, such as nylon, polyester, canvas, cotton, silk, plastic, foil, a para-aramid synthetic fiber (e.g., KEVLAR®), or any other flexible material capable of providing a suitable enclosure for maintaining stable environmental conditions within the enclosure 7001. In one embodiment, the enclosure 7001 resists, inhibits, and/or prevents environmental conditions outside the enclosure from intruding and/or infiltrating into the interior chamber formed by the enclosure. Enclosure 7001 may be easily set up and installed (and/or uninstalled) to surround at least one library access panel. For example, one or more side panels 7002 and the top panel may be self-supporting, or may be held by a collapsible and/or removable framework structure (not shown). The framework structure may be formed of any appropriate material, such as, for example, a plurality of fiberglass, aluminum, carbon fiber or para-aramid synthetic fiber (e.g., KEV-LAR®) poles, brackets, extensions, etc. The framework structure may be broken down so as to enable the enclosure 7001 to be portable and storable when not in use. Additionally, the framework structure may comprise a plurality of spring-biased joints, enabling the structure to automatically erect when opened. While shown partially surrounding the front panel 17 of library frame(s) 1002 in FIG. 11, it is to be understood that enclosure 7001 may or may not be erected alone and may not require the presence of one or more library frames 1002 in order to maintain shape and form. Alternatively, enclosure 7001 may be formed of a rigid structural enclosure, similar to enclosure 3001 described above, or it may be formed of a combination of rigid and flexible materials. If a rigid structural enclosure is used, access opening 7004 may be formed as a hinged door, similar to door 3006 described above with respect to FIG. 7.

When access opening 7004 is closed and/or sealed, enclosure 7001 may form a chamber having environmental conditions around and/or adjacent to the front panel 17 of library frame(s) 1002 that may be substantially separate from and different than the environmental conditions outside enclosure 7001. In one embodiment the enclosure may be substantially sealable. However, unlike enclosure 4001 described above with respect to FIG. 8, which may be brought to the same or similar environmental condition(s) as the interior of the library frame(s) 1002 via the environmental conditioning unit(s) associated with the library frame(s) 1002, enclosure 7001 may communicate with at least one separate environmental conditioning unit 7014. That is, at least one enclosure environmental conditioning unit(s) 7014 may be fluidly coupled to enclosure 7001 (e.g., via a duct 7012, attached to the top or side of enclosure 7001, etc.) such that the environmental conditions within enclosure 7001 may be controlled independently of the environmental conditions within library frame(s) 1002. As such, the enclosure 7001 may be brought to the same or similar environmental condition(s) as the interior environmental conditions of library frame(s) 1002 without the need for one or more vent(s), portal(s), etc. formed in the library frame(s) 1002. Such a configuration not only avoids the need for vent(s), portal(s), etc., but also lessens the burden on the environmental conditioning unit associated with the library frame(s) 1002, which may not have been originally sized and designed to handle the increased volume caused by the addition of enclosure 7001. Of course, enclosure 7001 may still utilize optional vent(s), portal(s), etc., formed in the library, which would communicate with the interior of the enclosure 7001 and/or the environmental conditioning unit associated with library frame(s) 1002. Enclosure 7001 may also utilize one or more environmental condition sensors 7005 (e.g., temperature and/or humidity sensors) so as to monitor the environmental conditions within the enclosure 7001.

The enclosure, in one embodiment, is configured and constructed to resist environmental conditions from the exterior of the library from intruding into the chamber of enclosure 7001, while permitting environmental conditioning unit(s) 7014 to change the environmental conditions therein. Measurements, readings, and/or signals from the one or more environmental condition sensors 7005 may be provided to a library controller (such as controller 400 shown and described with respect to FIG. 4), and/or may be provided to environmental conditioning unit 7014, and/or may be provided to an environmental conditioning unit associated with library frame(s) 1002 (such as environmental conditioning unit 1012 shown and described with respect to FIG. 5), and/or may be provided to a display (not shown)

such that the operator may determine the environmental conditions within the enclosure 7001. If readings are taken and supplied to the controller, in one aspect, the controller may make a comparison between the sensors inside the library, outside the library, and/or inside the enclosure and provide a visual, audible, and/or other alert or notification when access to the library may be made. Alternatively, enclosure 7001 may comprise no environmental condition sensors, and the operator or technician may rely solely on the passage of time or operator judgement as to when the environmental conditions are the same, similar to, sufficiently safe, and/or within a desired range as the corresponding environmental condition(s) within the library frame(s) 1002.

In one aspect, when cartridges need to be inserted or removed, or service is needed within library frame(s) 1002, enclosure 7001 may be installed and/or moved into place adjacent front panel 17 (or another access opening) of library frame(s) 1002. Environmental conditioning unit 7014 may then be fluidly coupled to the enclosure 7001 and operated so as to bring the environmental condition(s) within the enclosure 7001 to be at, near, and/or within a desired range of the corresponding environmental conditions within the library frame(s) 1002, allowing an operator to access the interior of library frame(s) 1002 while resisting an influx of external air into the frame(s) 1002. When the service procedure is complete, enclosure 7001 may be deconstructed and/or moved away from the library frame(s) 1002, along with enclosure environmental conditioning unit 7014. Alternatively, enclosure 7001 may be temporarily moved into place when operator access into a particular library frame or frames is needed, and/or may be moved away when access is no longer needed. For movement, enclosure 7001 may comprise wheels, rollers, skids, casters, sliders, etc. or may be lifted, hoisted, carried, pulled, pushed, slid, etc. In this way, a single enclosure 7001 and enclosure environmental conditioning unit 7014 may be portable and used only in an on-demand manner based on service needs.

In another aspect, enclosure 7001 may be normally installed adjacent frame(s) 1002 (i.e., permanently or semi-permanently), but enclosure environmental conditioning unit 7014 may be portable and movable between various enclosures. Thus, when service is needed within library frame(s) 1002, enclosure environmental conditioning unit 7014 may be coupled to an enclosure 7001 so as to bring the environmental condition(s) within the enclosure 7001 to be at or near those within the library frame(s) 1002. When the service procedure is complete, enclosure environmental conditioning unit 7014 may be decoupled from the enclosure 7001 such that it may be used at other locations in an on-demand manner based on service needs. It should be appreciated that enclosure environmental conditioning unit 7014 may be associated with and/or coupled to enclosures 2001, 3001, 4001, 5001, and/or 6001 in a manner similar to that described for enclosure 7001 and illustrated in FIG. 11.

Next, processes for accessing a data storage library in a manner that inhibits, restricts and/or prevents environmental conditions exterior of the library from intruding into the interior of the library is disclosed, which may be useful for example when importing or exporting cartridges or providing service on the data storage library. In one embodiment, an enclosure is provided to surround at least one access opening of a data storage library and provide a barrier for the library to inhibit, restrict, and/or prevent environmental conditions exterior of the library from intruding into the interior of the library. The enclosure preferably forms a chamber. The chamber is preferably of sufficient size to fit a technician therein. The interior of the enclosure is acclimated so that the environmental conditions within the chamber are at least closer to the environmental conditions of the interior of the library than the environmental conditions exterior or outside the enclosure. The enclosure may be acclimated in a number of ways, some of which were described above in connection with FIGS. 6-11. From within the enclosure, and preferably after the chamber of the enclosure has been sufficiently acclimated, a technician may access the interior of the data storage library.

As part of the process, the technician may access the interior of the enclosure through an access opening in the enclosure. The enclosure may have a barrier, for example, a door, associated with the enclosure access opening to selectively open and close or otherwise block the access opening. When access can be made to the interior of the library may be determined by a number of methods, including, but not limited to, waiting an amount of time for the enclosure to acclimate, waiting a predetermined, set amount of time for the chamber of the enclosure to acclimate, and/or relying on various sensors to make measurements and comparing sensor readings. In one aspect, determining when access can be made to the interior of the library may be based upon technician judgement, or alternatively by sensors, instruments, calculations, and comparisons relying on microprocessors and other automated functions. In the data storage library, how close and/or the desired range or threshold is a design parameter that may vary based upon a number of factors, including the design and specifications of the data storage library, the environmental conditions exterior to the data storage library, the design and construction of the enclosure, whether environmental conditioning units are utilized, as well as other factors. Access opening 7004 or it associated access door may comprise a means for determining if the opening is closed (or sealed). For example, the access opening or access door may comprise a switch or sensor that is coupled to a controller (such as library controller 400 shown and described with respect to FIG. 4), a library environmental conditioning unit, enclosure environmental conditioning unit 7014, and/or an audio or visual indicator. The switch or sensor may be used to alert a technician (anyone that requires access to the interior of the library) that access opening 7004 is open, it may be used to control the movement of conditioned air from library frame(s) 1002 into the chamber 2010, it may be used to activate/deactivate a library environmental conditioning unit and/or it may be used to activate/deactivate enclosure environmental conditioning unit 7014. While flat sides and rectangular shapes are described and shown with respect to FIG. 11, enclosure 7001 may comprise other shapes and sides (e.g., circular, cylindrical, spherical, triangular, etc.).

Figure 12:
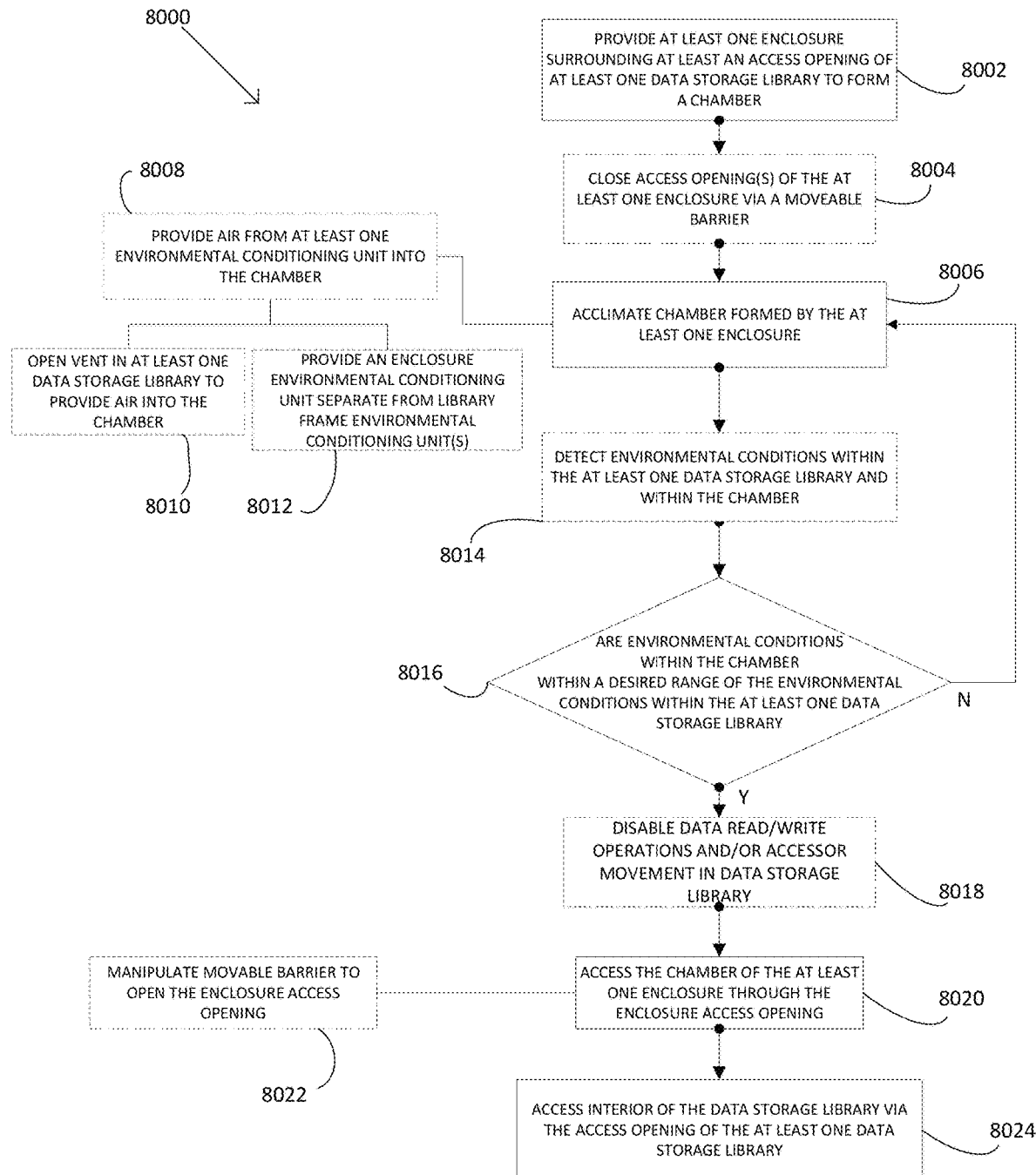
FIG. 12 is a flowchart of a method of accessing a data storage library to perform a service procedure within the data storage library in accordance with one aspect.

Referring to FIG. 12, a process 8000 for accessing a data storage library to perform a service procedure therein according to one embodiment is disclosed. While process 8000 may be considered for the sake of convenience and not with the intent of limiting the disclosure as comprising a series and/or number of steps, it is to be understood that the process does not need be performed as a series of steps and/or the steps do not need to be performed in the order shown and described with respect to FIG. 12. It is to be understood that the library may be nonoperational, partially operational, or fully operational during a service procedure. At 8002, at least one enclosure is provided, with the at least one enclosure surrounding at least a library access opening of at least one data storage library. The at least one enclosure forms a interior chamber. At 8004, any access doors associated with access opening(s) of the at least one enclosure may be closed. However, it is to be understood that access opening(s) need not always be closed, and thus 8004 may be optional. At 8006, the chamber formed by the enclosure is acclimated to the desired environmental conditions found within the data storage library. Such acclimation may be accomplished, at 8008, by providing air from at least one environmental conditioning unit into the chamber, either through an opening (e.g., a vent, crack, etc.) in the at least one data storage library or directly to/from library frame environmental conditioning unit(s) to provide air into the chamber (at 8010), and/or by providing a dedicated enclosure environmental conditioning unit separate from the library frame environmental conditioning unit(s) so as to deliver conditioned air into the chamber (at 8012).

At 8014, the environmental conditions within both the at least one data storage library and the chamber may be detected. Alternatively, the passage of time may be detected at 8014 if there are no environmental sensors. At 8016, a determination is made whether or not the environmental conditions within the chamber are within a desired range of the environmental conditions within the at least one data storage library. Alternatively, at 8016, a determination may be made as to a certain predetermined or calculated passage of time. Still further, 8014 and 8016 may comprise technician judgement as to whether or not the environmental conditions within the chamber are within a desired range of the environmental conditions within the at least one data storage library. If no, the chamber continues to acclimate toward the environmental conditions within the at least one data storage library. However, if yes, the data read/write operations of the data storage library and/or any accessor movements within the data storage library may optionally be disabled at 8018 (e.g., for technician safety from being struck by a moving robot), and the chamber of the enclosure is accessed through the enclosure access opening at 8020. For example, the chamber may be accessed by manipulating an access door (e.g., a library door, I/O station access port, a removable panel, etc.) in order to open the enclosure access opening at 8022. Finally, the interior of the data storage library is accessed via the library access opening of the at least one data storage library at 8024, thereby enabling insert or removal of media, a service, upgrade and/or maintenance procedure to be performed within the data storage library while minimizing and/or preventing the intrusion of unconditioned air from the external environment (e.g., the data center) into the data storage library.

Figure 13:
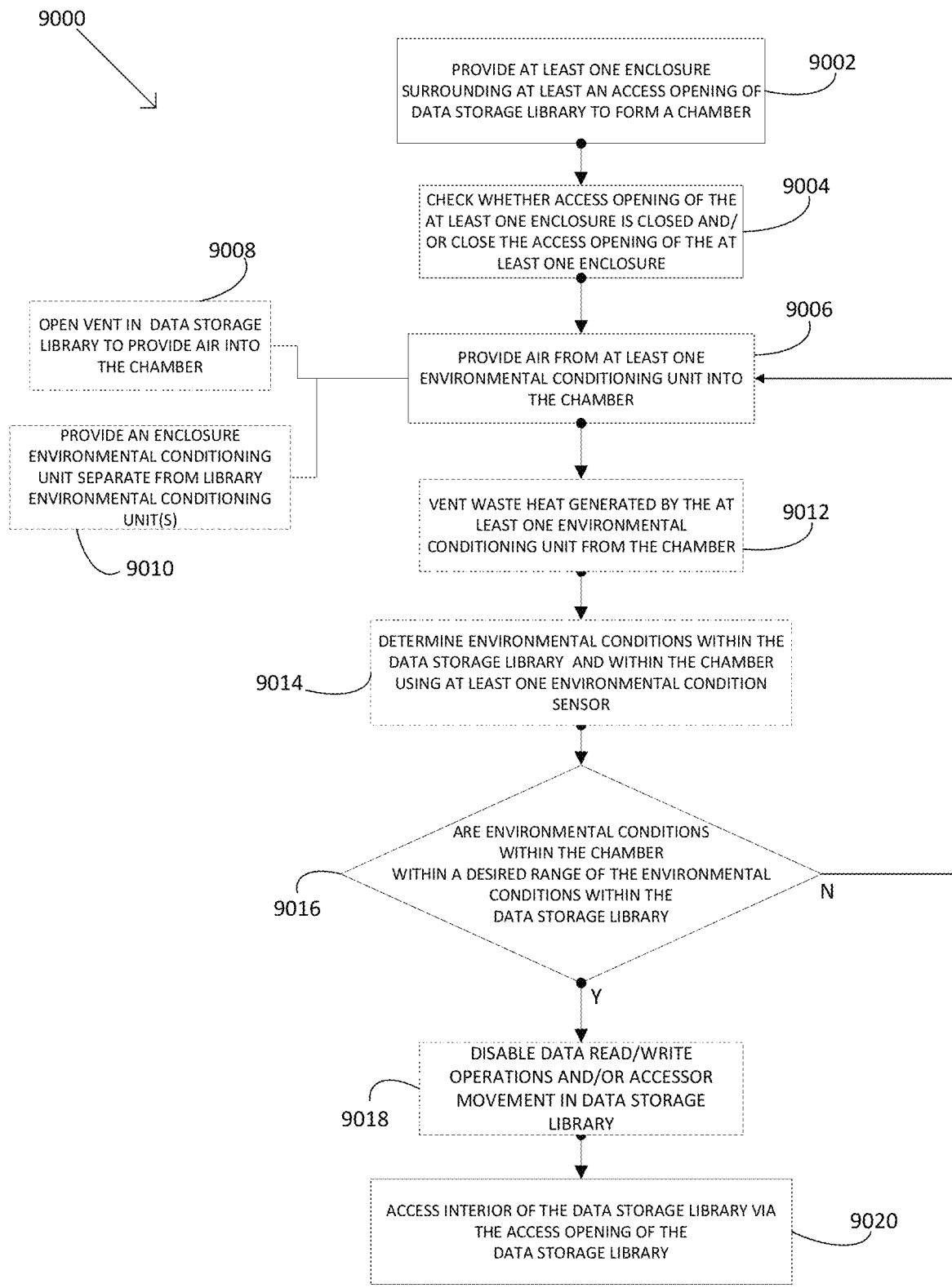
FIG. 13 is a flowchart of a method of accessing a data storage library to perform a service procedure within the data storage library in accordance with another aspect.

Referring now to FIG. 13, a process 9000 for accessing the interior of a data storage library to perform a service procedure according to another embodiment is disclosed. While process 9000 may be considered for the sake of convenience and not with the intent of limiting the disclosure as comprising a series and/or number of steps, it is to be understood that the process does not need to be performed as a series of steps and/or the steps do not need to be performed in the order shown and described with respect to FIG. 13. It is to understood that the library may be nonoperational, partially operational, or fully operational during the service procedure. At 9002, at least one enclosure is provided surrounding at least a library access opening of a data storage library, thereby forming a chamber around at least the library access opening of the data storage library. At 9004, any access door(s) associated with the access opening(s) of the at least one enclosure may be closed. However, it is to be understood that access opening(s) need not always be closed, and thus 9004 may be optional. At 9006, air from at least one environmental conditioning unit is provided into the chamber. For example, the air may either be provided from the interior of the data storage library via an open vent in the data storage library (or directly from a library environmental conditioning unit) at 9008, and/or the air may be provided via an enclosure environmental conditioning unit separate from any library environmental conditioning unit(s) at 9010.

Optionally, at 9012, waste air generated by the at least one environmental conditioning unit of the data storage library may optionally be vented to avoid mixing with air in the chamber. At 9014, optionally the environmental conditions within both the at least one data storage library and the chamber may be determined via at least one environmental condition sensor. At 9016, optionally a determination is made whether or not the environmental conditions within the chamber are within a desired range of the environmental conditions within the at least one data storage library. If no, air from the at least one environmental conditioning unit continues to be provided into the chamber. However, if yes, in one embodiment, any accessor movements within the data storage library may optionally be disabled at 9018, and the interior of the data storage library is accessed via the access opening of the data storage library at 9020, thereby enabling insert or removal of media, a service, upgrade and/or maintenance procedure to be performed within the library frame(s). If environmental condition sensors are not provided and/or the passage of time is desired for determining if the environmental conditions within the chamber are within a desired range of the environmental conditions within the at least one data storage library, then 9014 may optionally determine the passage of time and 9016 may optionally make a determination of a predetermined or calculated amount of elapsed time.

Figure 14:
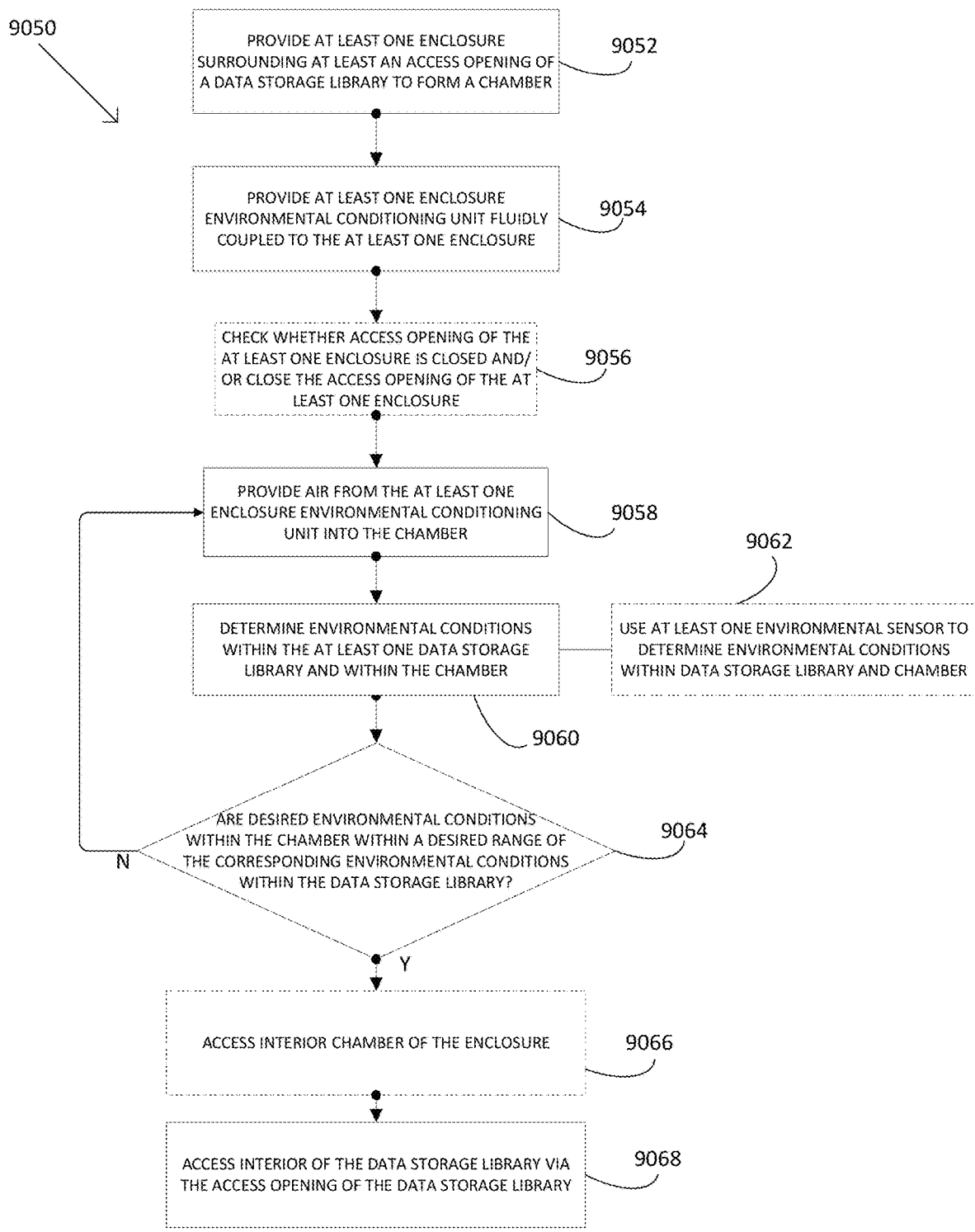
FIG. 14 is a flowchart of a method of accessing a data storage library to perform a service procedure within the data storage library in accordance with yet another aspect.

Referring now to FIG. 14, a process 9050 for accessing the interior of a data storage library in one embodiment to perform a service procedure is disclosed. While process 9050 may be considered for the sake of convenience and not with the intent of limiting the disclosure as comprising a series and/or number of steps, it is to be understood that the process does not need to be performed as a series of steps and/or the steps do not need to be performed in the order shown and described with respect to FIG. 14. At 9052, at least one enclosure is provided surrounding at least an access opening of a data storage library, thereby forming a chamber around at least the access opening. At 9054, at least one enclosure environmental conditioning unit is provided, wherein the at least one enclosure environmental conditioning unit is fluidly coupled to the at least one enclosure. At 9056, any access door(s) associated with access opening(s) of the at least one enclosure may be closed. However, it is to be understood that access opening(s) need not always be closed (or manually closed), and thus 9056 may be optional.

At 9058, air from the at least one enclosure environmental conditioning unit is provided into the chamber. The environmental conditions within the at least one data storage library and within the chamber optionally may be determined at 9060. For example, at least one environmental sensor may be used to determine the environmental conditions within the data storage library and within the chamber at 9062. At 9064, optionally a determination is made whether or not the environmental conditions within the chamber are within a desired range of the environmental conditions within the data storage library. If no, air from the at least one enclosure environmental conditioning unit continues to be provided into the chamber. However, if yes, the interior of the chamber may be accessed at 9066, and the interior of the data storage library is accessed via the access opening of the data storage library at 9068, thereby enabling insert or removal of media, a service, upgrade and/or maintenance procedure to be performed within the library frame(s). If environmental condition sensors are not provided and/or the passage of time is desired for determining if the environmental conditions within the chamber are within a desired range of the environmental conditions within the at least one data storage library, then 9060 may optionally determine the passage of time while 9062 may optionally be omitted, and 9064 may optionally make a determination of a predetermined or calculated amount of elapsed time.

Figure 15:
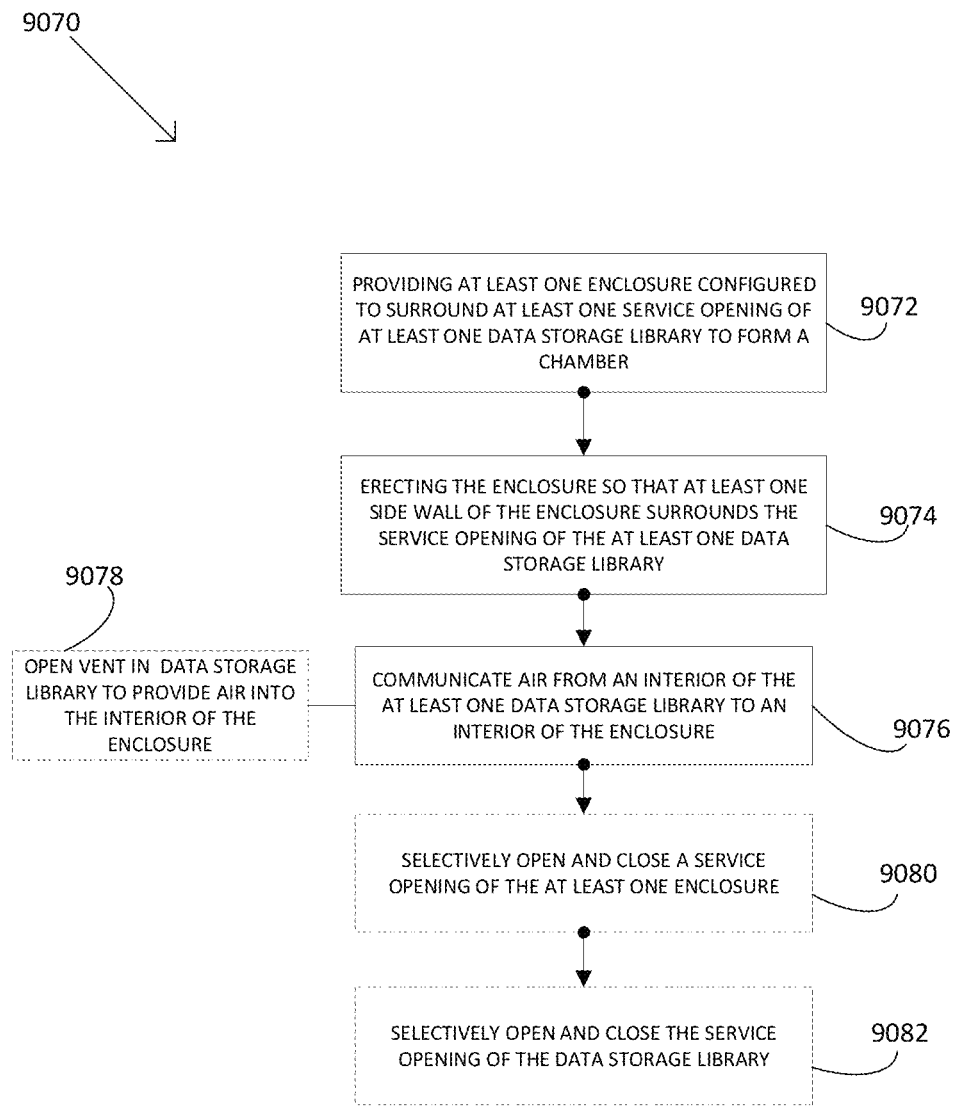
FIG. 15 is a flowchart of a method of accessing a data storage library to perform a service procedure within the data storage library in accordance with yet another aspect.

Referring to FIG. 15, a process 9070 for accessing the interior of a data storage library to perform a service procedure according to yet another embodiment is disclosed. While process 9070 may be considered for the sake of convenience and not with the intent of limiting the disclosure as comprising a series and/or number of steps, it is to be understood that the process does not need to be performed as a series of steps and/or the steps do not need to be performed in the order shown and described with respect to FIG. 15.

At 9072, at least one enclosure is provided, wherein the at least one enclosure is configured to surround at least one service opening of at least one data storage library, thereby forming a chamber around the at least one service opening of the at least one data storage library. At 9074, the enclosure is erected so that at least one side wall of the enclosure surrounds the service opening of the at least one data storage library. At 9076, air from the interior of the at least one data storage library is communicated into the interior of the enclosure. This transfer of air may optionally be achieved by opening a vent in the data storage library at 9078. The vent may be opened manually (e.g., by a technician moving a vent closure, closing an enclosure service opening, enclosure access door, etc.) or automatically (e.g., using actuators or motors under the control of a library controller or under the control of an environmental conditioning unit).

At 9080, optionally an access door associated with the access opening of the at least one enclosure may be selectively opened and closed so as to allow a technician access into the enclosure. The movable panel associated with the access opening of the data storage library may be selectively opened, removed and/or closed, thereby allowing the technician to access the interior of the data storage library from the enclosure at 9082.

Figure 16:
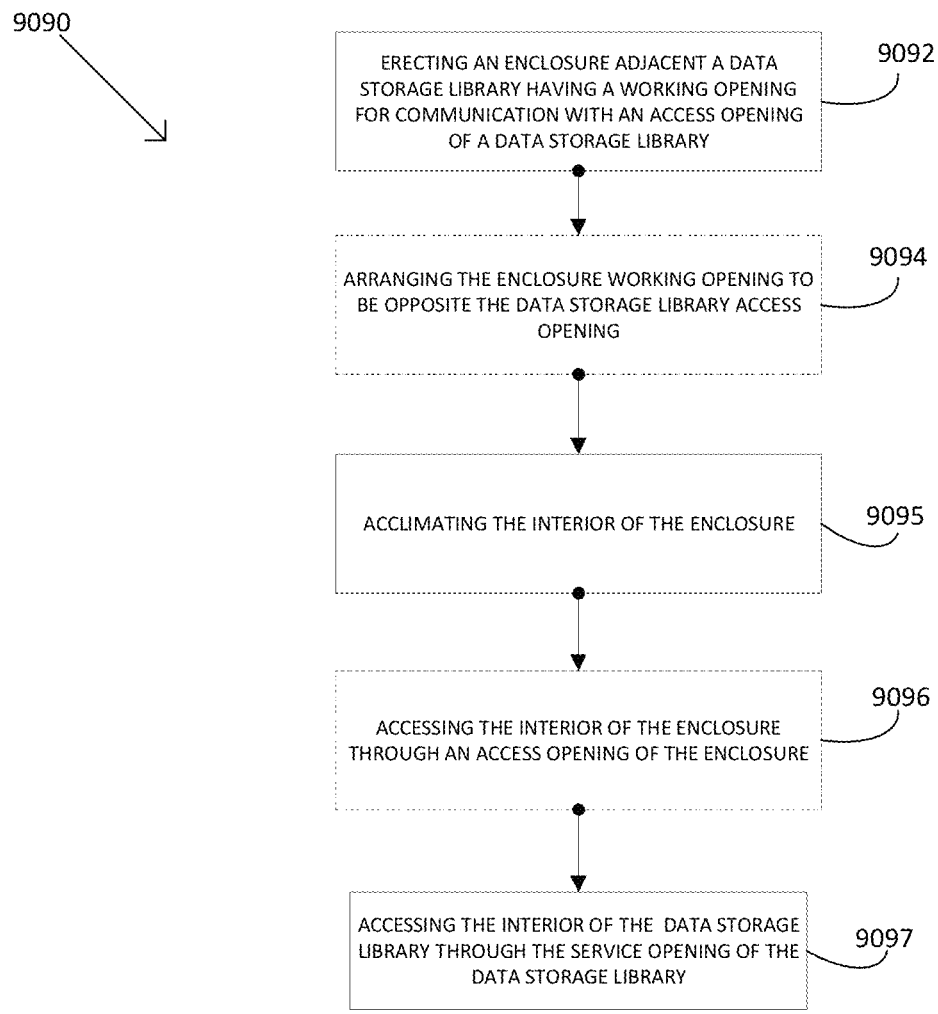
FIG. 16 is a flowchart of a method of accessing a data storage library to perform a service procedure within the data storage library in accordance with yet another aspect.

Referring now to FIG. 16, a process 9090 for accessing the interior of a data storage library to perform a service procedure according to yet another embodiment is disclosed. While process 9090 may be considered for the sake of convenience and not with the intent of limiting the disclosure as comprising a series and/or number of steps, it is to be understood that the process does not need to be performed as a series of steps and/or the steps do not need to be performed in the order shown and described with respect to FIG. 16.

At 9092, an enclosure is erected or moved into place adjacent a data storage library, with the enclosure having a working opening. The enclosure working opening is configured to be in communication with an access opening of the data storage library. Specifically, at 9094, the enclosure working opening may be arranged to be opposite the data storage library access opening.

At 9095, the interior of the enclosure is acclimated, thereby bringing the environmental conditions within the enclosure to be at, near, and/or within a desired range of the environmental conditions within the data storage library. At 9096, a technician optionally may access the interior of the enclosure through an access opening. The technician may access the interior of the data storage library through the enclosure working opening and the access opening of the data storage library at 9097. Such selective access may enable insert or removal of media, a service, upgrade and/or maintenance procedure to be performed within the data storage library while minimizing and/or preventing the intrusion of unconditioned air from the external environment (e.g., the data center) into the data storage library.

It follows that various embodiments described and/or suggested herein are able to provide data storage systems, and optionally, automated data storage libraries having environmental control capabilities associated with the automated data storage library, with at least one enclosure capable of providing an environmentally-controlled access point. As a result, favorable conditions (e.g., temperature, humidity, absence of contaminants, etc.) may be maintained for the data storage drives, data storage cartridges, and/or data storage media which may be stored in the library frame, even during service procedures in which the access door(s) or panel(s) of the library frame must be opened. Undesirable environmental conditions (e.g., air contaminants, condensation formation and/or accumulation on the media, and its subsequent effect on contacting devices) may also be resisted, inhibited, and preferably avoided. Inhibiting and substantially avoiding the formation and accumulation of condensation and moisture may be particularly beneficial for tape libraries, tape cartridges and tape media.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

A data processing system suitable for storing and/or executing program code may include at least one processor, which may be or be part of a controller, coupled directly or indirectly to memory elements through a system bus, such as controller 400 of FIG. 4. The memory elements can include local memory employed during actual execution of the program code, such as nonvolatile memory 404 of FIG. 4, bulk storage, and cache memories which provide temporary storage of at least some program code in order to reduce the number of times code must be retrieved from bulk storage during execution.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of servicing a data storage library within a data room, the data storage library having a data storage library frame having at least one library access opening to permit access to an interior of the data storage library frame, the method comprising:
providing an enclosure configured to surround only one side of the data storage library frame having the at least one library access opening to form a chamber, wherein the enclosure is configured and constructed to resist external environmental conditions from intruding into the chamber of the enclosure and to permit environmental conditions from the interior of the data storage library frame to intrude into the chamber of the enclosure;
providing an enclosure environmental conditioning unit, the enclosure environmental conditioning unit being separate from any environmental conditioning unit associated with the data storage library frame that is configured to condition the interior of the data storage library frame;
configuring the enclosure environmental conditioning unit to condition the chamber of the enclosure;
acclimating the interior chamber of the enclosure using the enclosure environmental conditioning unit so that at least one desired environmental condition in the chamber is within a desired range of the corresponding environmental condition within the interior of the data storage library frame;
accessing the chamber of the enclosure through at least one enclosure access opening; and
accessing the interior of the data storage library frame via the at least one library access opening.

2. The method of claim 1, further comprising closing the at least one enclosure access opening.

3. The method of claim 2, wherein closing the at least one enclosure access opening comprises closing an enclosure access door associated with the at least one enclosure access opening and wherein the enclosure access door consists of at least one enclosure access door selected from the group of a hinged flap, a hinged door, a zippered door, one or more vertically-hanging slats, a split membrane, an air curtain, a sliding panel, and a rolled door.

4. The method of claim 1, further comprising selectively providing air from the interior of the data storage library frame to the chamber of the enclosure.

5. The method of claim 4, further comprising selectively opening at least one vent on the data storage library frame in communication with the chamber of the enclosure.

6. The method of claim 1, further comprising determining the desired environmental condition within the chamber of the enclosure and the corresponding environmental condition within the data storage library frame.

7. The method of claim 6, wherein the desired environmental condition in the chamber of the enclosure is determined using an environmental condition sensor located within the chamber of the enclosure and wherein the corresponding environmental condition within the data storage library frame is determined using an environmental condition sensor located within the data storage library frame.

8. The method of claim 6, further comprising determining whether the environmental condition within the interior chamber of the enclosure is within a desired range of the corresponding environmental condition within the interior of the data storage library.

9. The method of claim 1, wherein the desired environmental condition in the chamber of the enclosure is at least one of temperature and humidity.

10. A method of servicing a data storage library in a data room, the data storage library having a data storage library frame having at least one library access opening to permit access to an interior of the data storage library frame, the method comprising:
providing an enclosure configured to surround only one side of the data storage library frame having the at least one library access opening to form an interior chamber, the enclosure having at least one enclosure access opening to permit access to the interior chamber, wherein the at least one enclosure is configured and constructed to resist external environmental conditions from intruding into the interior chamber of the enclosure while permitting the environmental conditions from within the data storage library frame to intrude into the interior chamber of the enclosure;
providing air from at least one environmental conditioning unit directly into the interior chamber of the enclosure, wherein the environmental conditioning unit is associated with and for directly conditioning the interior chamber of the enclosure and which does not directly condition the interior of the data storage library frame; and
accessing the data storage library frame via the at least one library access opening when at least one desired environmental condition within the interior of the enclosure is within range of the corresponding environmental condition within an interior of the data storage library frame.

11. The method of claim 10, further comprising checking if the at least one enclosure access opening is closed and, if not, closing the at least one enclosure access opening.

12. The method of claim 10, further comprising venting waste air generated by the at least one environmental conditioning unit so that it is not directed toward or into the interior of the enclosure.

13. The method of claim 10, further comprising selectively opening at least one vent on the data storage library frame in communication with the interior of the enclosure.

14. The method of claim 10, further comprising determining the desired environmental condition in the chamber of the enclosure using an environmental condition sensor located within the chamber of the enclosure and determining the corresponding environmental condition within the data storage library frame using an environmental condition sensor located within the data storage library frame.

15. The method of claim 10, wherein the environmental conditioning unit further comprises an environmental conditioning unit associated with and for conditioning an interior of the data storage library frame.

16. A method of servicing a data storage library in a data room, the data storage library having a data storage library frame having at least one library access opening to permit access to an interior of the data storage library frame, the method comprising:
providing an enclosure configured to surround only one side of the data storage library frame having the at least one library access opening to form a chamber, wherein the enclosure is configured and constructed to resist external environmental conditions from intruding into the chamber of the enclosure;

providing at least one enclosure environmental conditioning unit fluidly coupled to the enclosure;
providing air from the at least one enclosure environmental conditioning unit to an interior of the enclosure;
checking whether at least one desired environmental condition within the interior of the enclosure is within a range of the corresponding environmental condition within the interior of the data storage library frame; and
accessing the data storage library frame via the at least one library access opening.

17. The method of claim 16, wherein the desired environmental condition includes at least one of temperature and humidity.

18. The method of claim 16, further comprising determining the desired environmental condition in the chamber of the enclosure using an environmental condition sensor located within the chamber of the enclosure and determining the corresponding environmental condition within the data storage library frame using an environmental condition sensor located within the data storage library frame, and further comprises accessing at least one of the interior chamber of the enclosure and the interior of the data storage library frame when it is determined that the desired environmental condition within the interior of the enclosure is within a desired range of the corresponding environmental condition within the interior of the data storage library frame.

19. A method of controlling at least one environmental condition during service of a data storage library in a data room, the data storage library having a data storage library frame, the method comprising:
providing an enclosure configured to surround at least one library access opening on one side of the data storage library frame to form a chamber, the enclosure having at least one wall, the at least one wall containing at least one working opening and at least one enclosure access opening to permit access to the chamber, and wherein the enclosure is configured and constructed to form a barrier to resist external environmental conditions from intruding into the chamber of the enclosure, and the working opening permits environmental conditions from within the data storage library frame to intrude into the chamber of the enclosure;
at least one of erecting and moving the enclosure so that at least one wall surrounds the at least one library access opening and forms a barrier to the external environmental conditions, and wherein the working opening of the enclosure is in communication with the library access opening to permit access to the interior of the data storage library frame;
providing an enclosure environmental conditioning unit, the enclosure environmental conditioning unit being separate from any environmental conditioning unit associated with the data storage library frame that is configured to condition the interior of the data storage library frame;
configuring the enclosure environmental conditioning unit to condition the chamber of the enclosure; and
communicating air from an interior of the data storage library frame to an interior of the enclosure.

20. The method of claim 19, wherein the air from the interior of the data storage library frame is communicated into the interior of the enclosure through at least one vent in the data storage library frame.

21. The method of claim 20, wherein the at least one vent is selectively openable and closable.

22. A method of controlling at least one environmental condition exterior of an access opening to a data storage library in a data room, the data storage library having a data storage library frame having the access opening, the method comprising:
at least one of erecting and moving an enclosure having at least one wall forming a barrier to resist at least one environmental condition from intruding into the interior of the enclosure, the at least one wall of the enclosure arranged to form a chamber and have a working opening for communication with the access opening on only one side of the data storage library frame, and to have at least one enclosure access opening in communication with the interior of the chamber and the exterior of the data storage library frame;
supplying conditioned air to the interior of the enclosure from a separate enclosure environmental conditioning unit;
acclimating the interior of the enclosure to within a desired range of the desired environmental conditions of the interior of the data storage library frame; and
accessing the interior of the data storage library frame through the access opening of the data storage library frame.

23. The method of claim 22, comprising acclimating the interior of the enclosure via conditioned air from the interior of the data storage library frame over a period of time.

24. The method of claim 22, further comprising supplying conditioned air to the interior of the enclosure from the interior of the data storage library frame, a library environmental conditioning unit, and a separate enclosure environmental conditioning unit.

* * * * *